(12) United States Patent
Khater et al.

(10) Patent No.: US 6,864,560 B2
(45) Date of Patent: Mar. 8, 2005

(54) BIPOLAR TRANSISTOR STRUCTURE WITH A SHALLOW ISOLATION EXTENSION REGION PROVIDING REDUCED PARASITIC CAPACITANCE

(75) Inventors: Marwan H. Khater, Poughkeepsie, NY (US); Jae-Sung Rieh, Fishkill, NY (US); Andreas Daniel Stricker, Essex Junction, VT (US); Gregory Gower Freeman, Hopewell Junction, NY (US); Kathryn Turner Schonenberg, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,299

(22) Filed: Mar. 28, 2003

(65) Prior Publication Data

US 2004/0188797 A1 Sep. 30, 2004

(51) Int. Cl.⁷ ................ H01L 27/082; H01L 27/102; H01L 29/70; H01L 31/11
(52) U.S. Cl. ................................... 257/565
(58) Field of Search ............... 257/565–580, 257/583, 584, 585, 586, 587

(56) References Cited

U.S. PATENT DOCUMENTS

| | | | | |
|---|---|---|---|---|
| 5,382,828 A | * | 1/1995 | Neudeck et al. | 257/596 |
| 5,397,904 A | * | 3/1995 | Arney et al. | 257/66 |
| 6,287,930 B1 | * | 9/2001 | Park | 438/369 |
| 6,396,107 B1 | * | 5/2002 | Brennan et al. | 257/362 |
| 6,486,532 B1 | * | 11/2002 | Racanelli | 257/571 |
| 6,566,715 B1 | * | 5/2003 | Ker et al. | 257/355 |

* cited by examiner

Primary Examiner—Long Pham
Assistant Examiner—Dana Farahani
(74) Attorney, Agent, or Firm—Graham S. Jones, II; H. Daniel Schnurmann

(57) ABSTRACT

A bipolar vertical transistor is formed in a silicon semiconductor substrate which has an upper surface with STI regions formed therein composed of a dielectric material formed in the substrate having inner ends and top surfaces. A doped collector region is formed in the substrate between a pair of the STI regions. A counterdoped intrinsic base region is formed on the upper surface of the substrate between the pair of the STI regions with a margin between the intrinsic base region and the pair of STI regions, the intrinsic base region having edges. A doped emitter region is formed above the intrinsic base region spaced away from the edges. A shallow isolation extension region composed of a dielectric material is next to the edges of the intrinsic base region formed in the margin between the STI regions and the intrinsic base region. An extrinsic base region covers the shallow isolation extension region and extends partially over the intrinsic base region in mechanical and electrical contact therewith, whereby the shallow isolation extension region reduces the base-to-collector parasitic capacitance of the bipolar transistor.

20 Claims, 19 Drawing Sheets

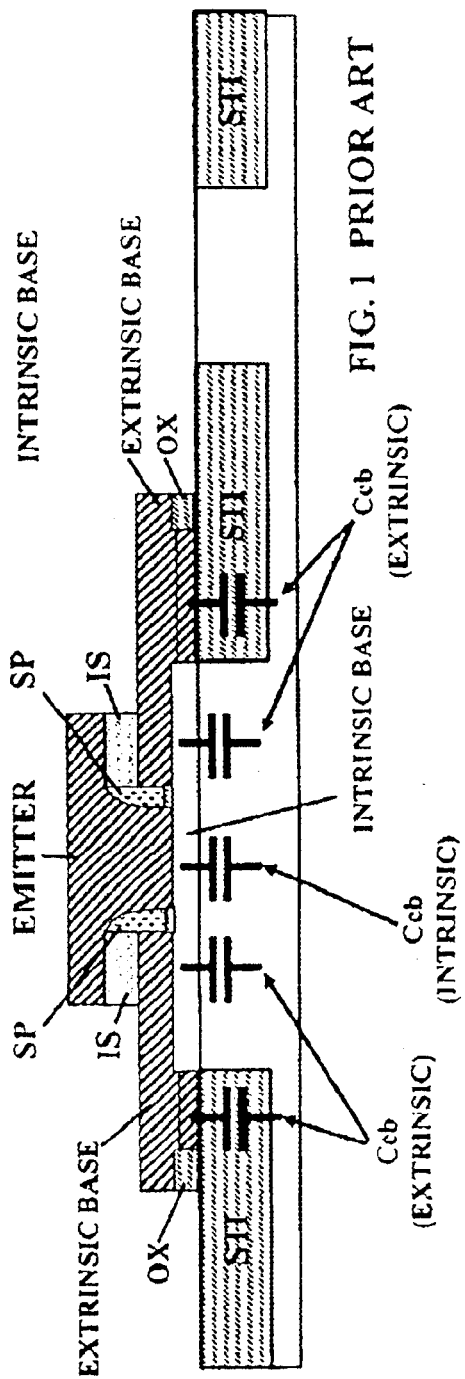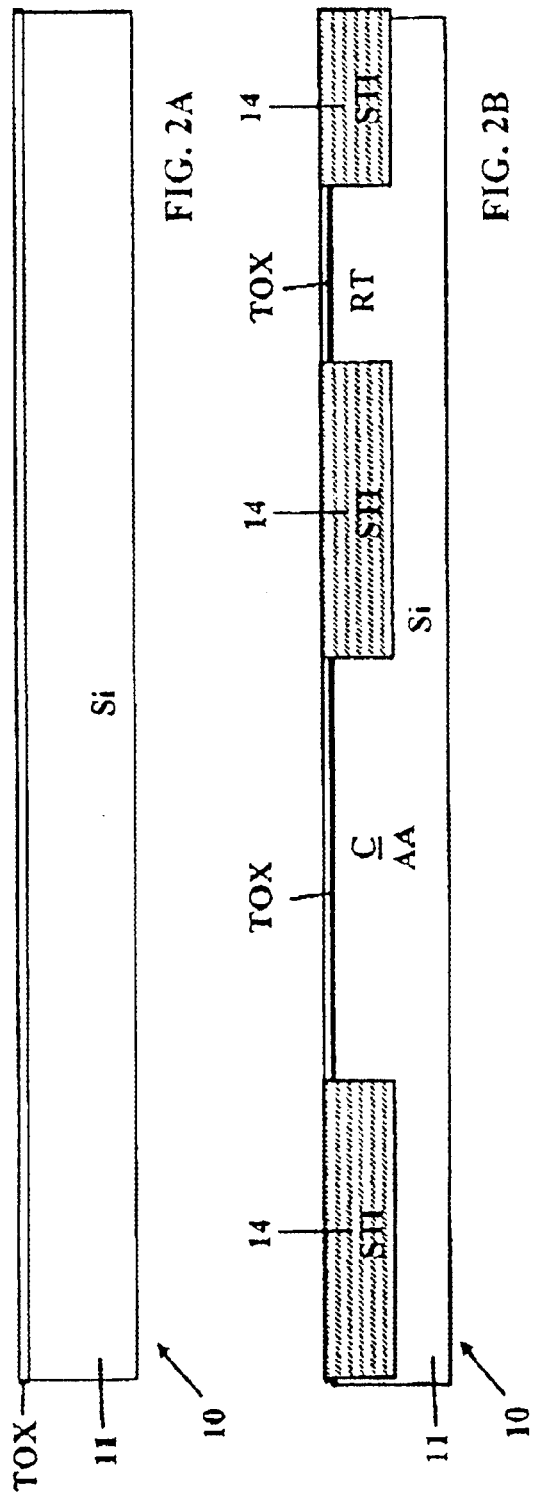

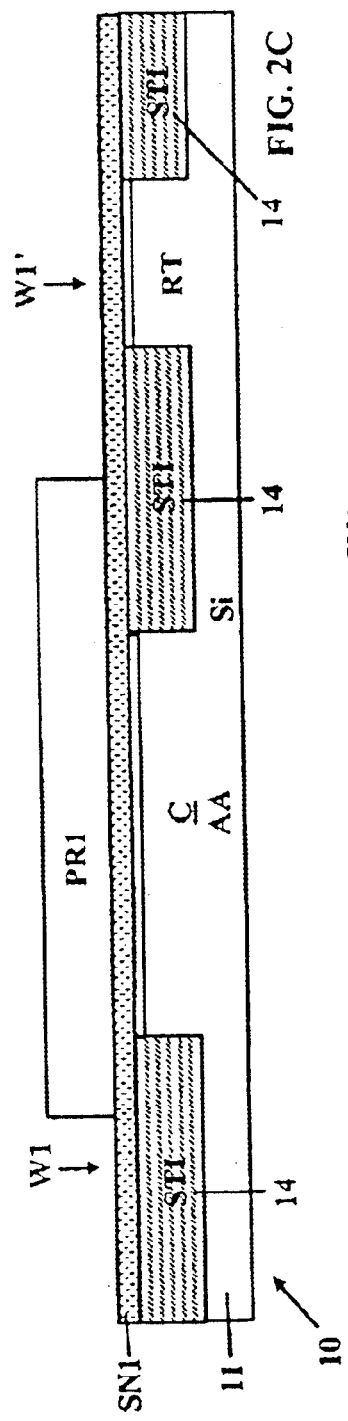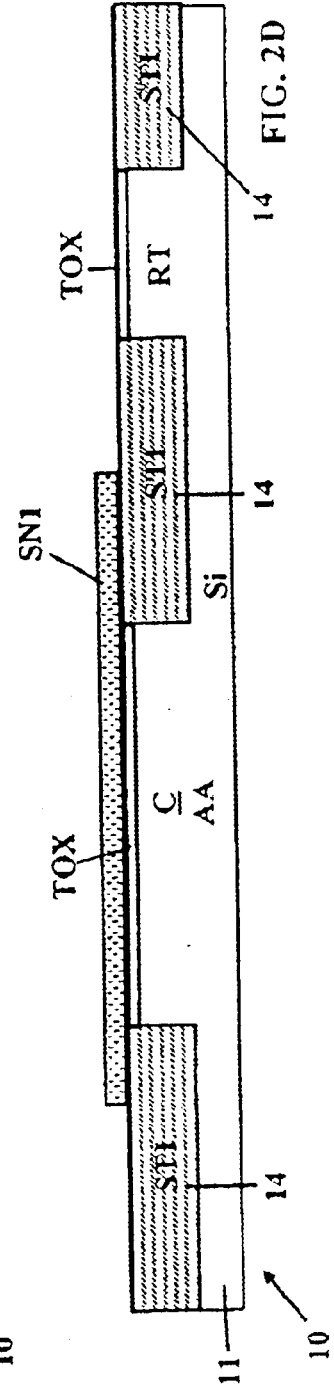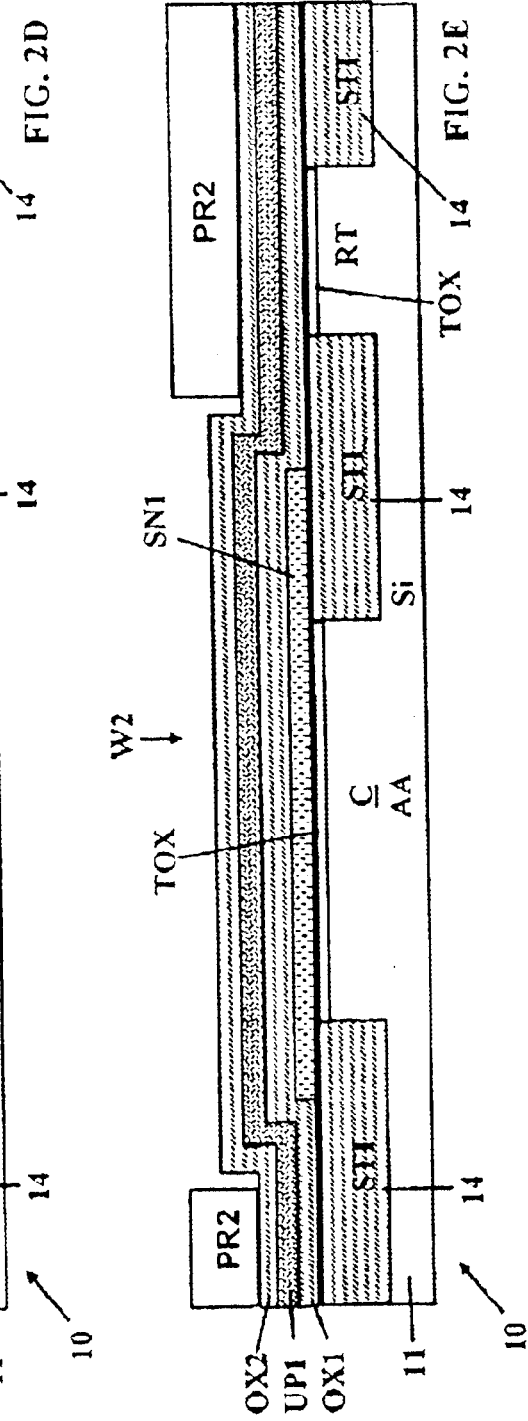

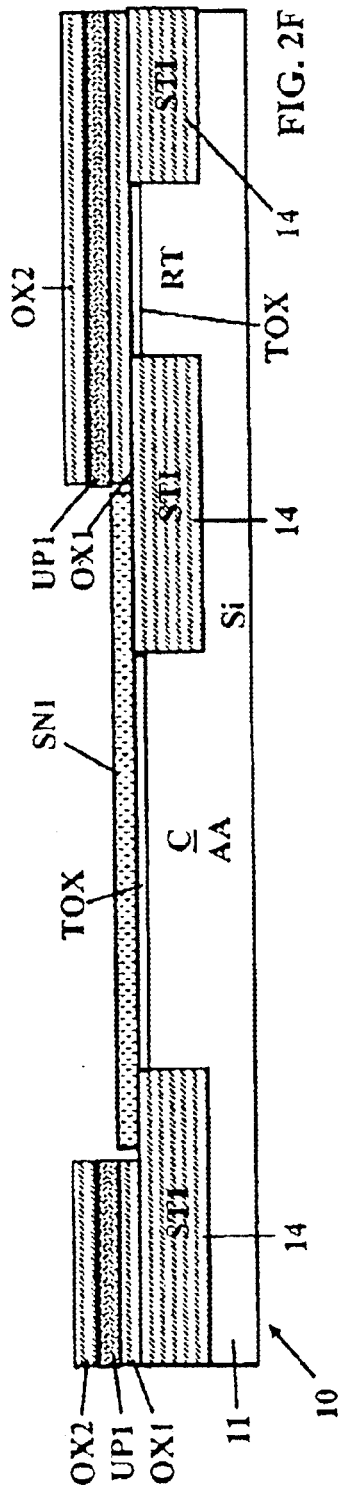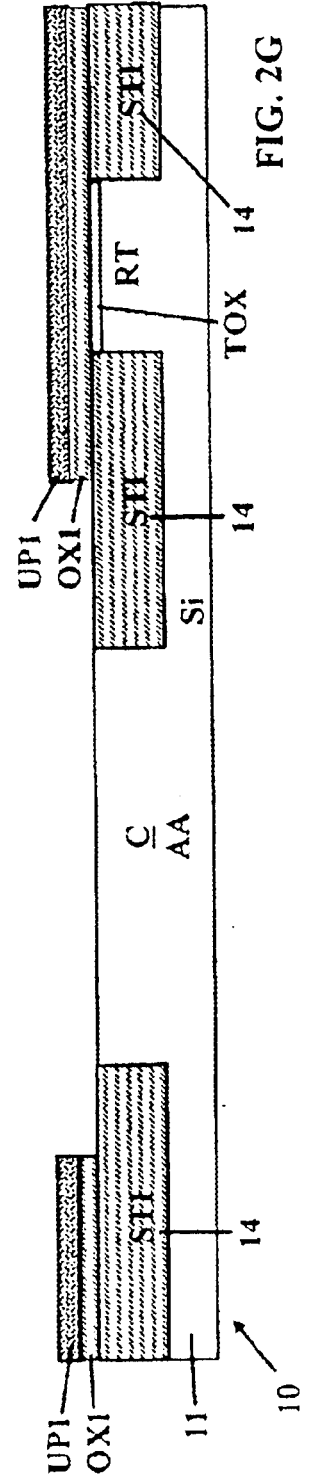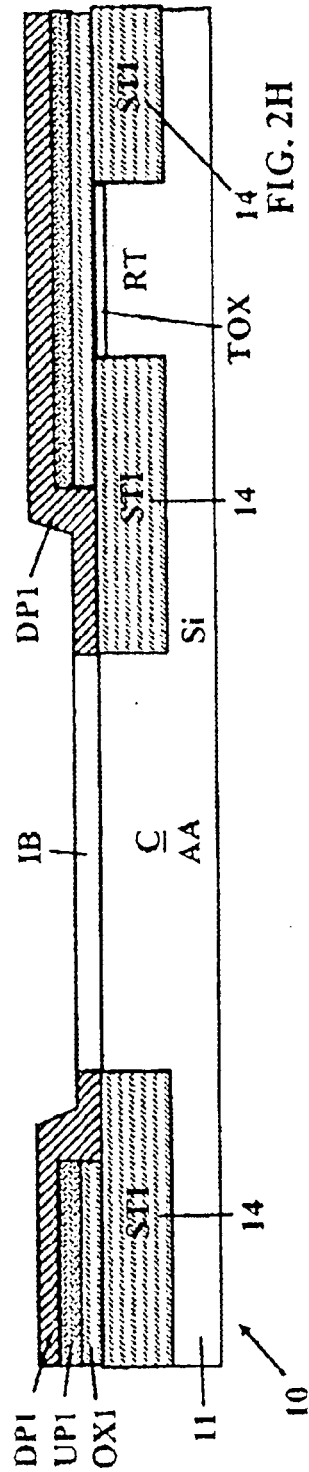

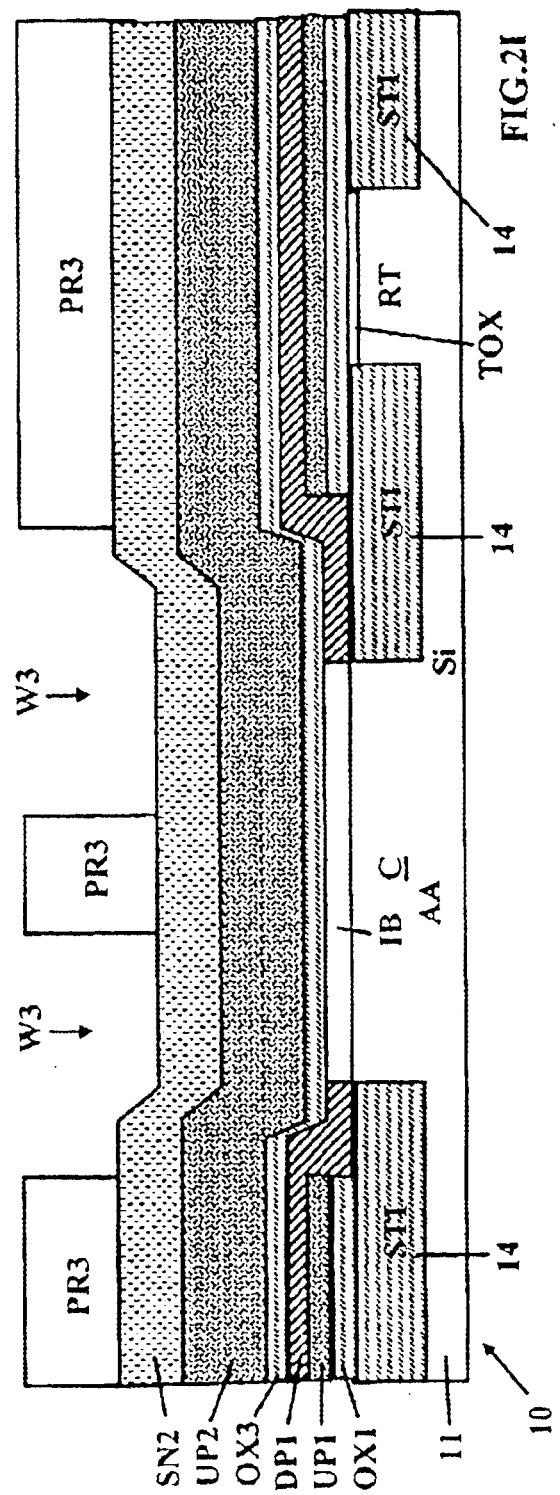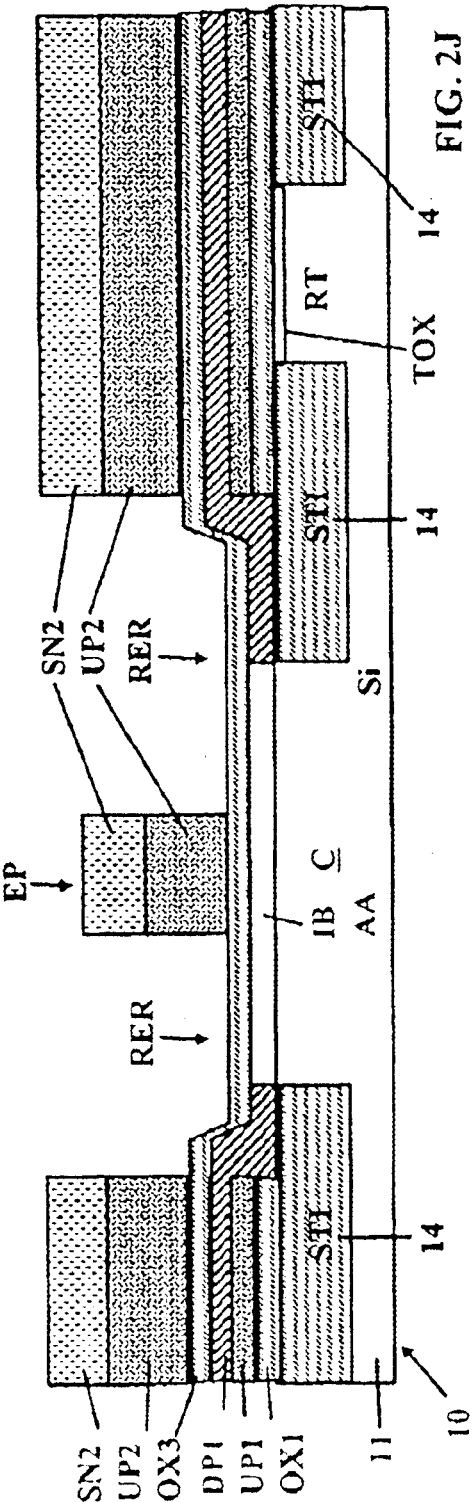

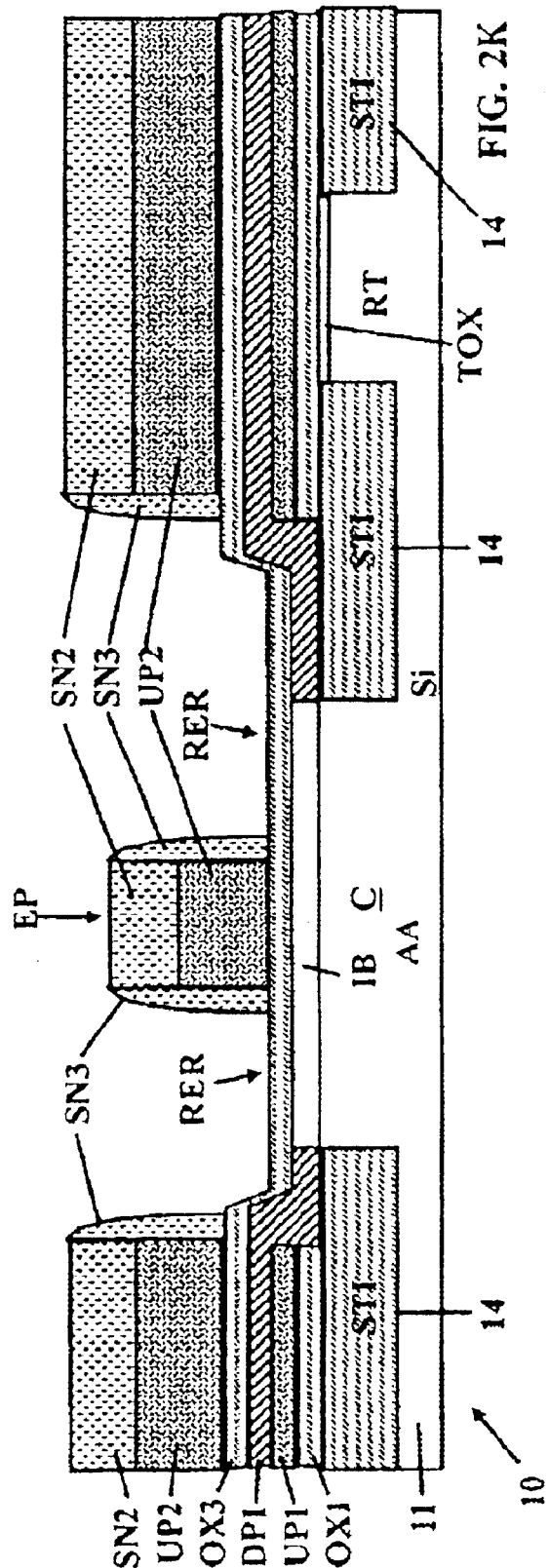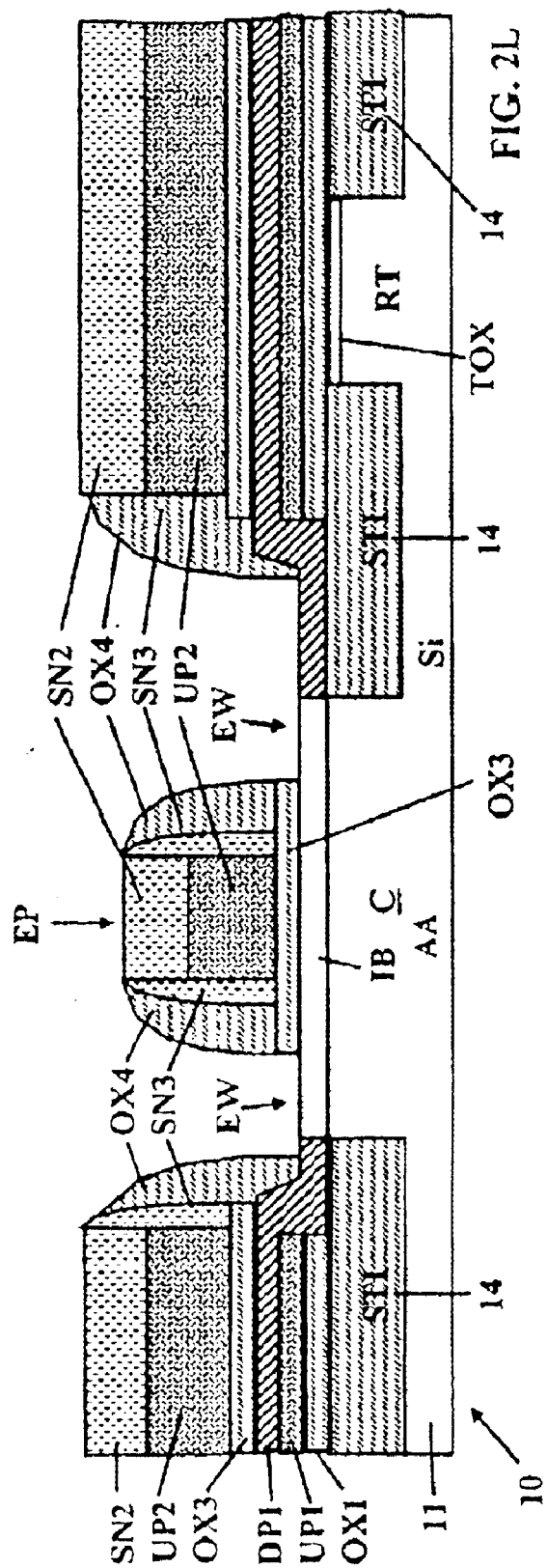

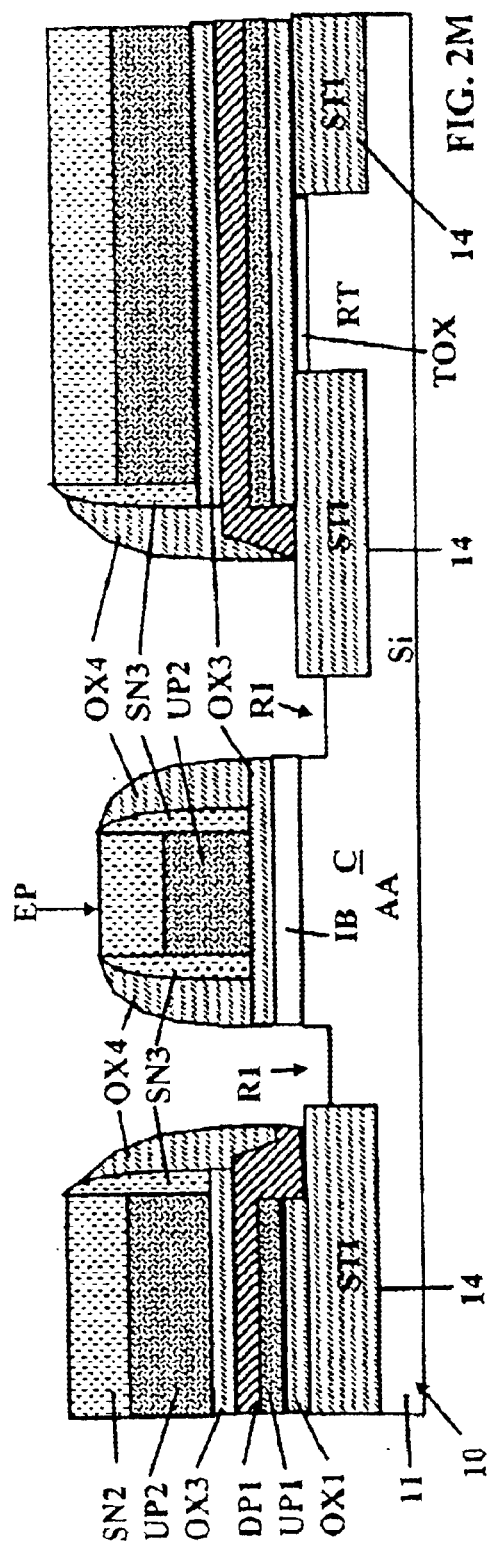
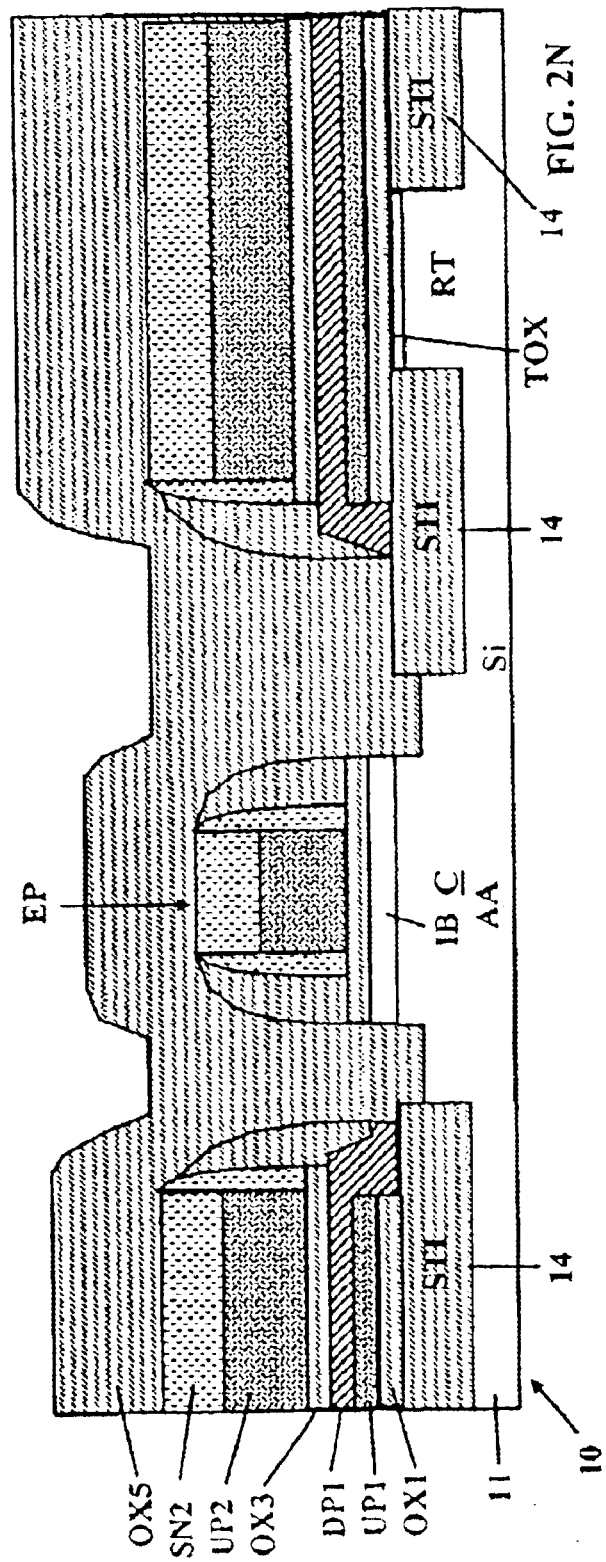

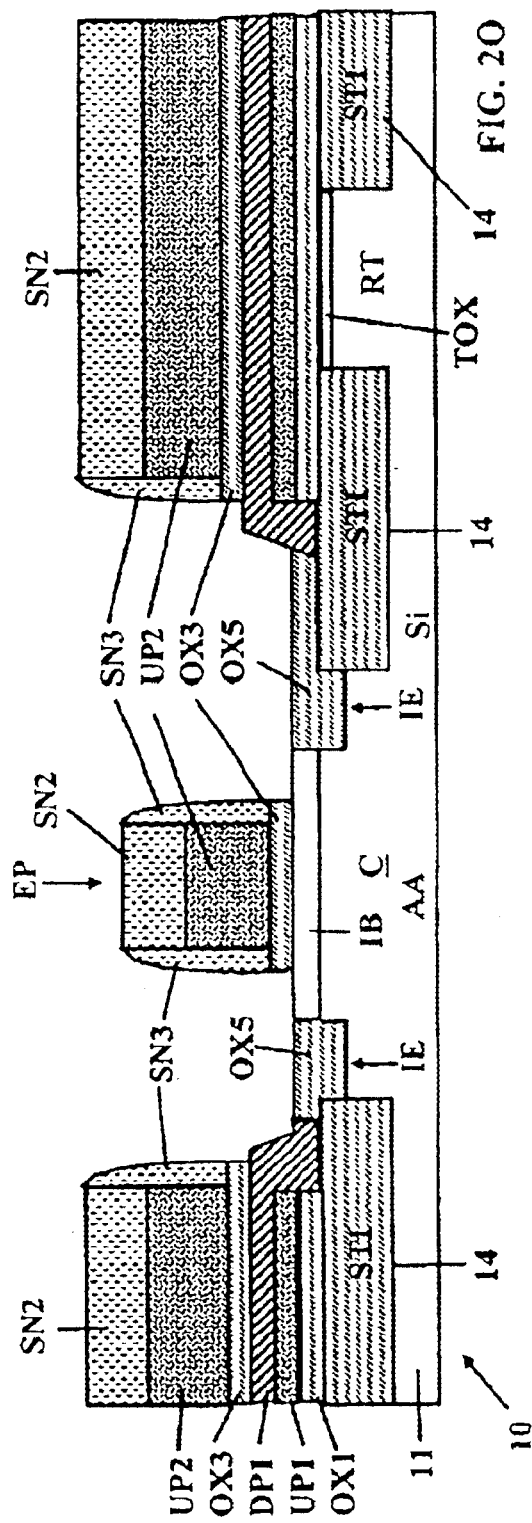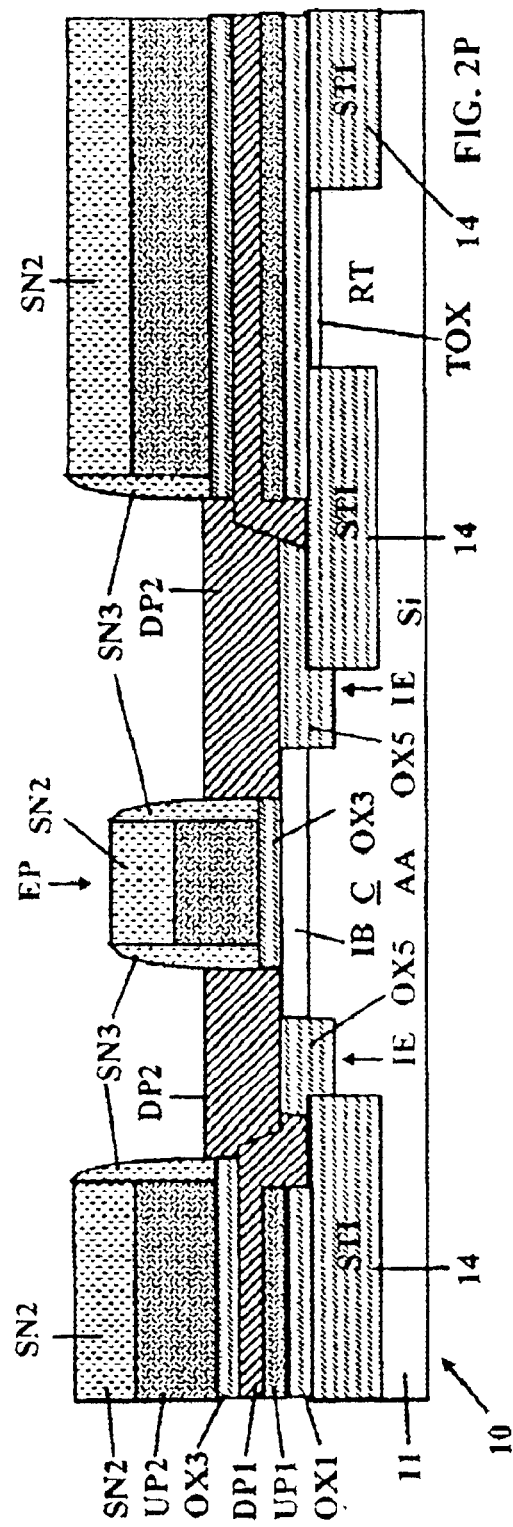

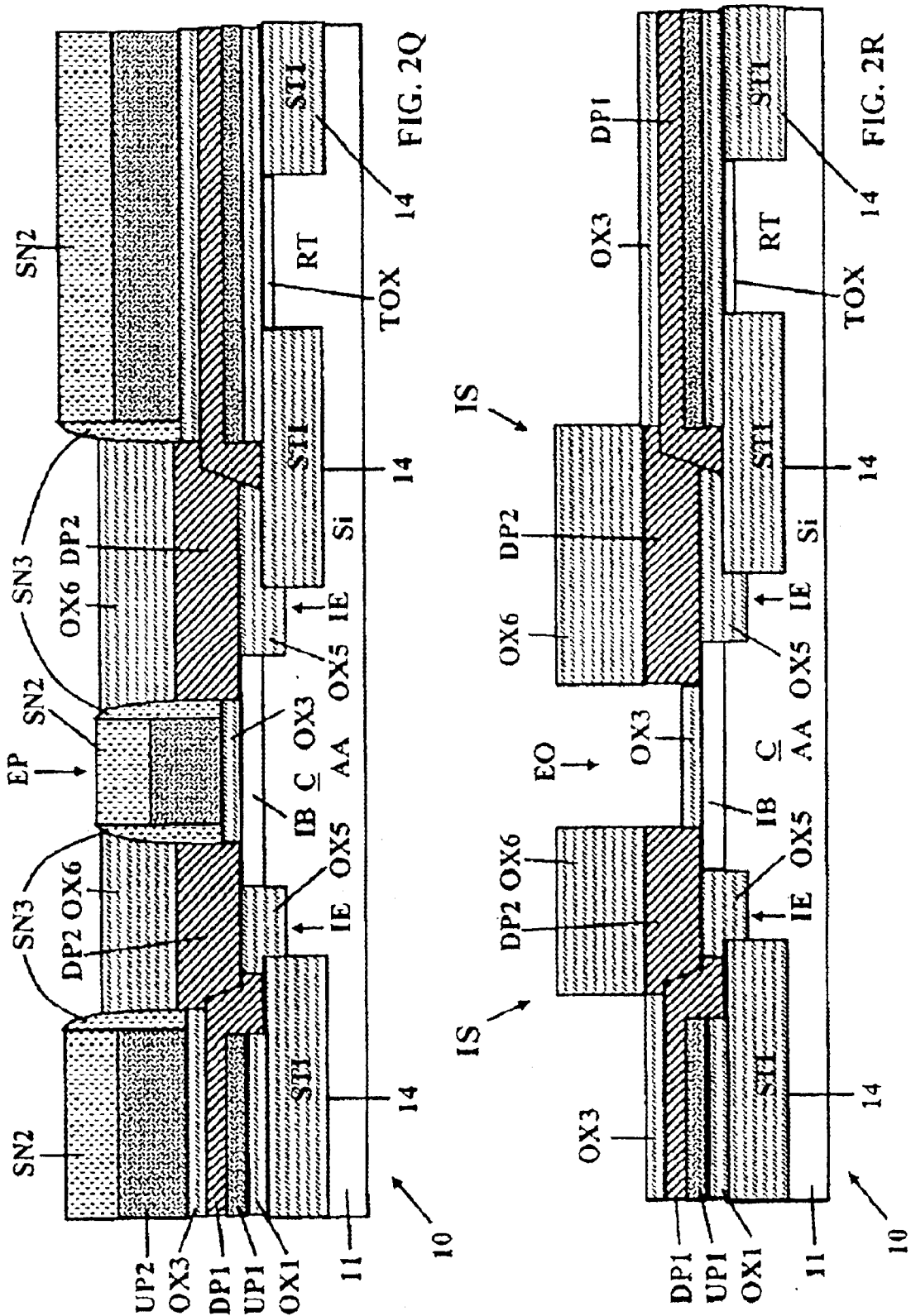

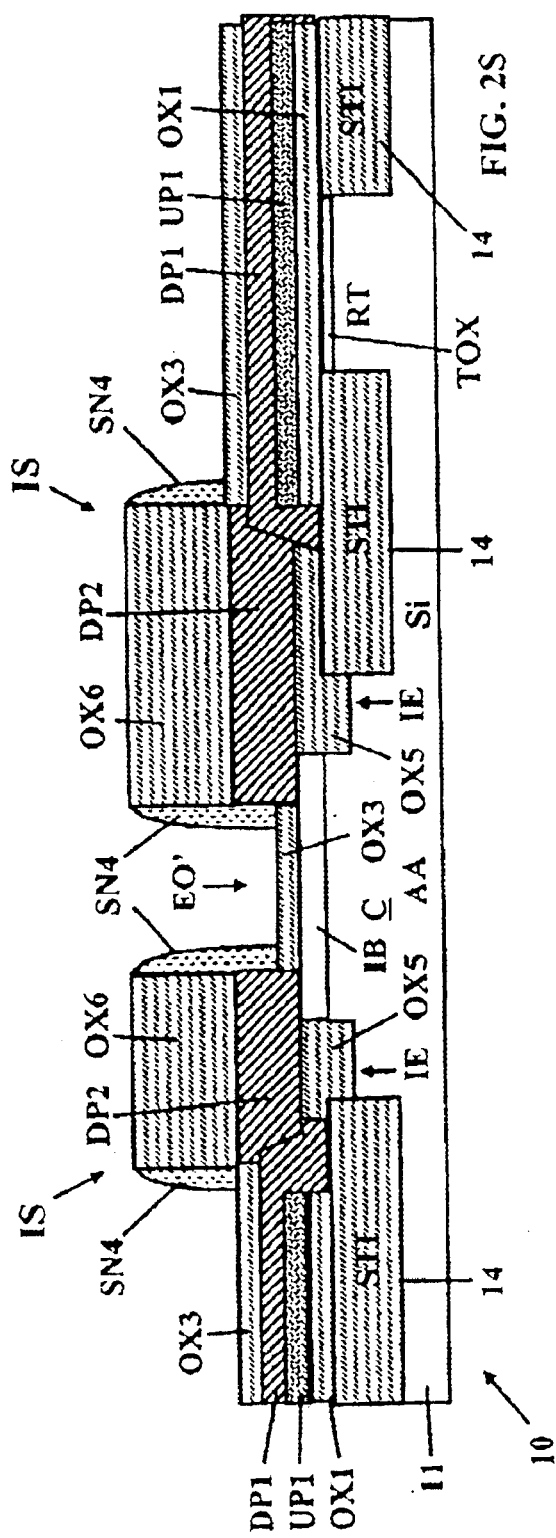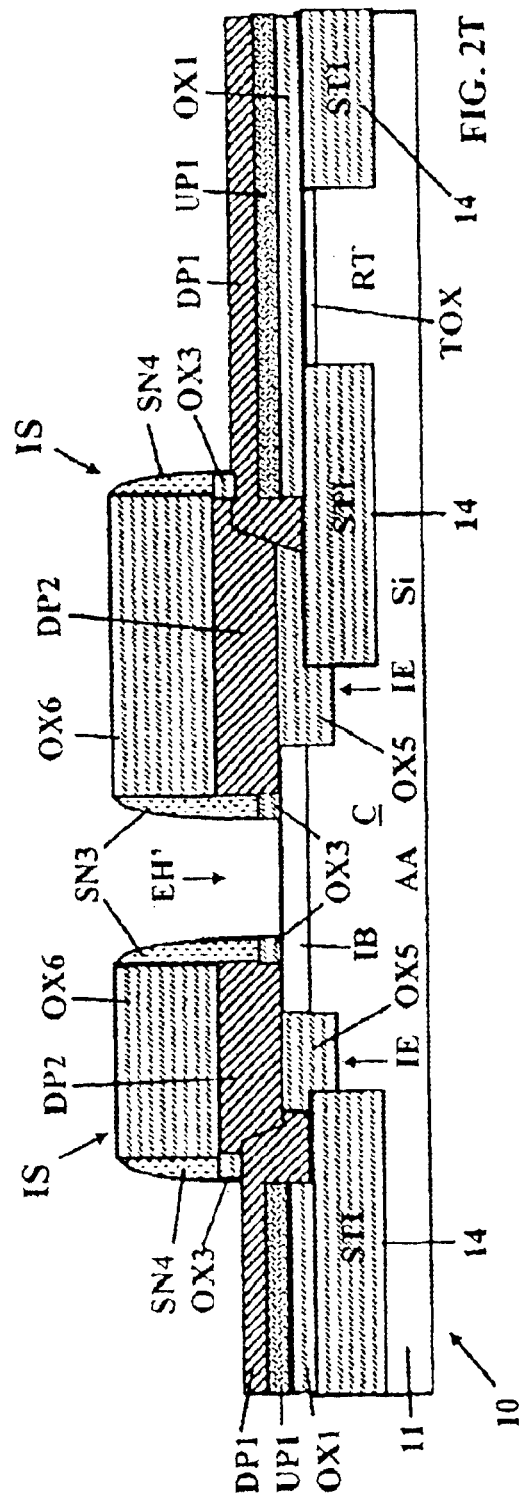

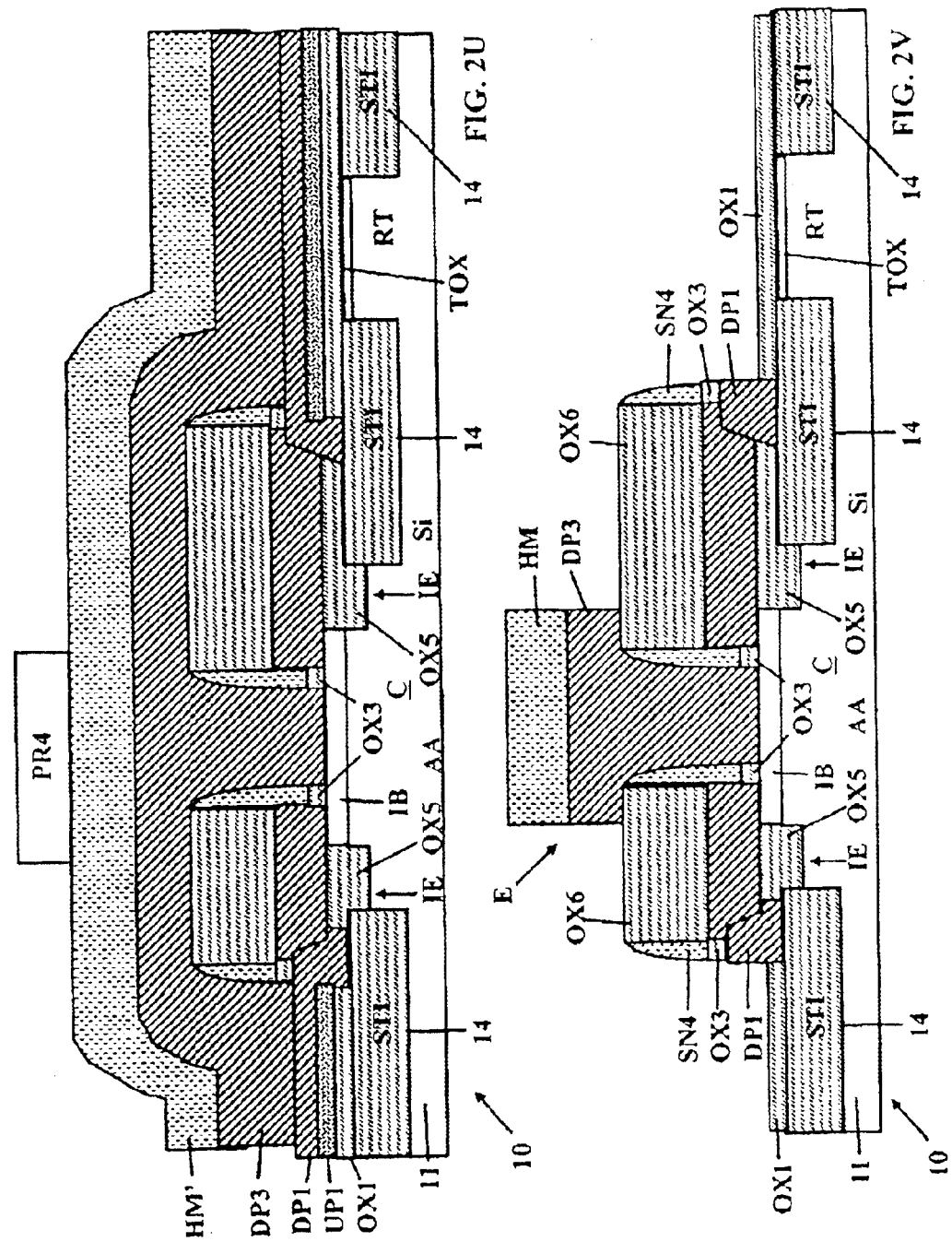

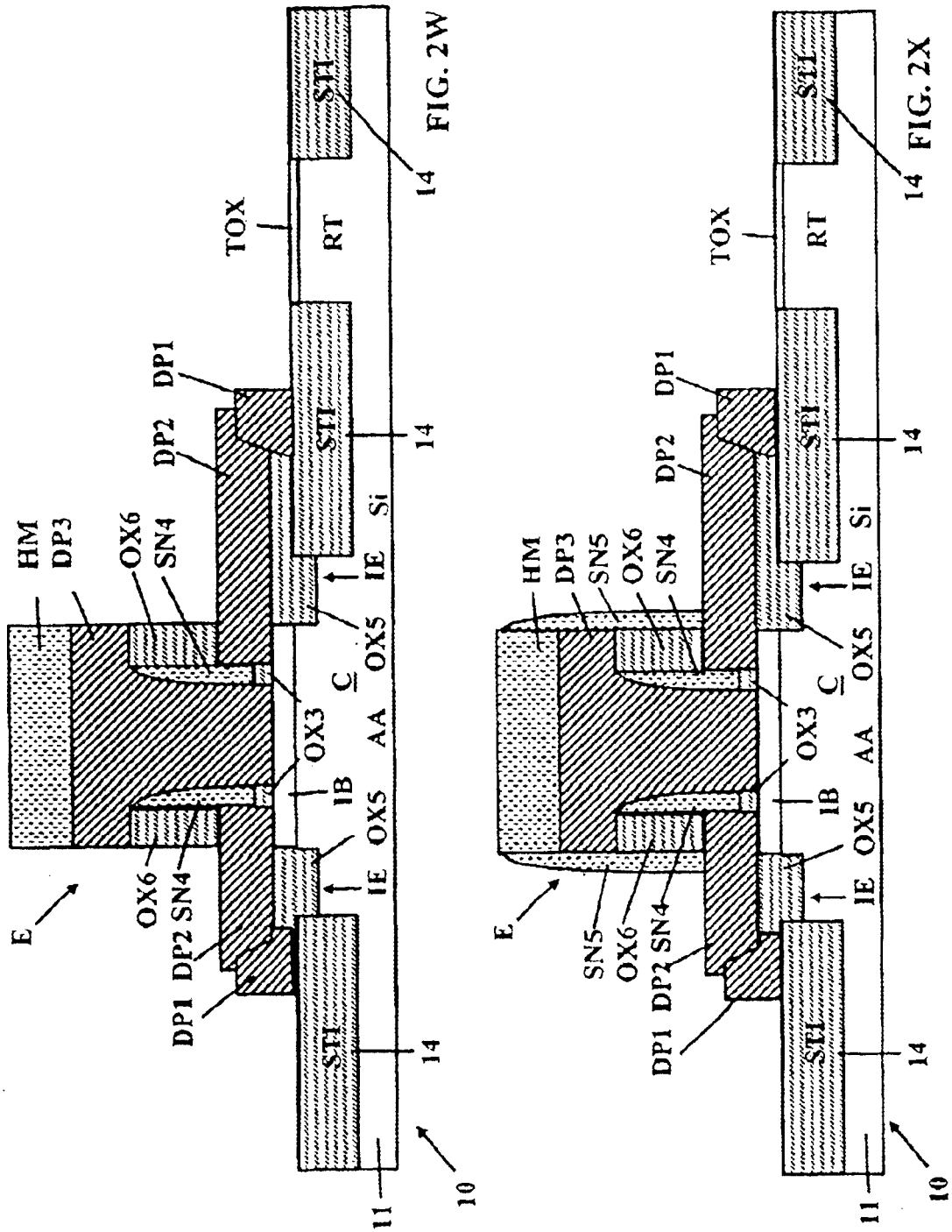

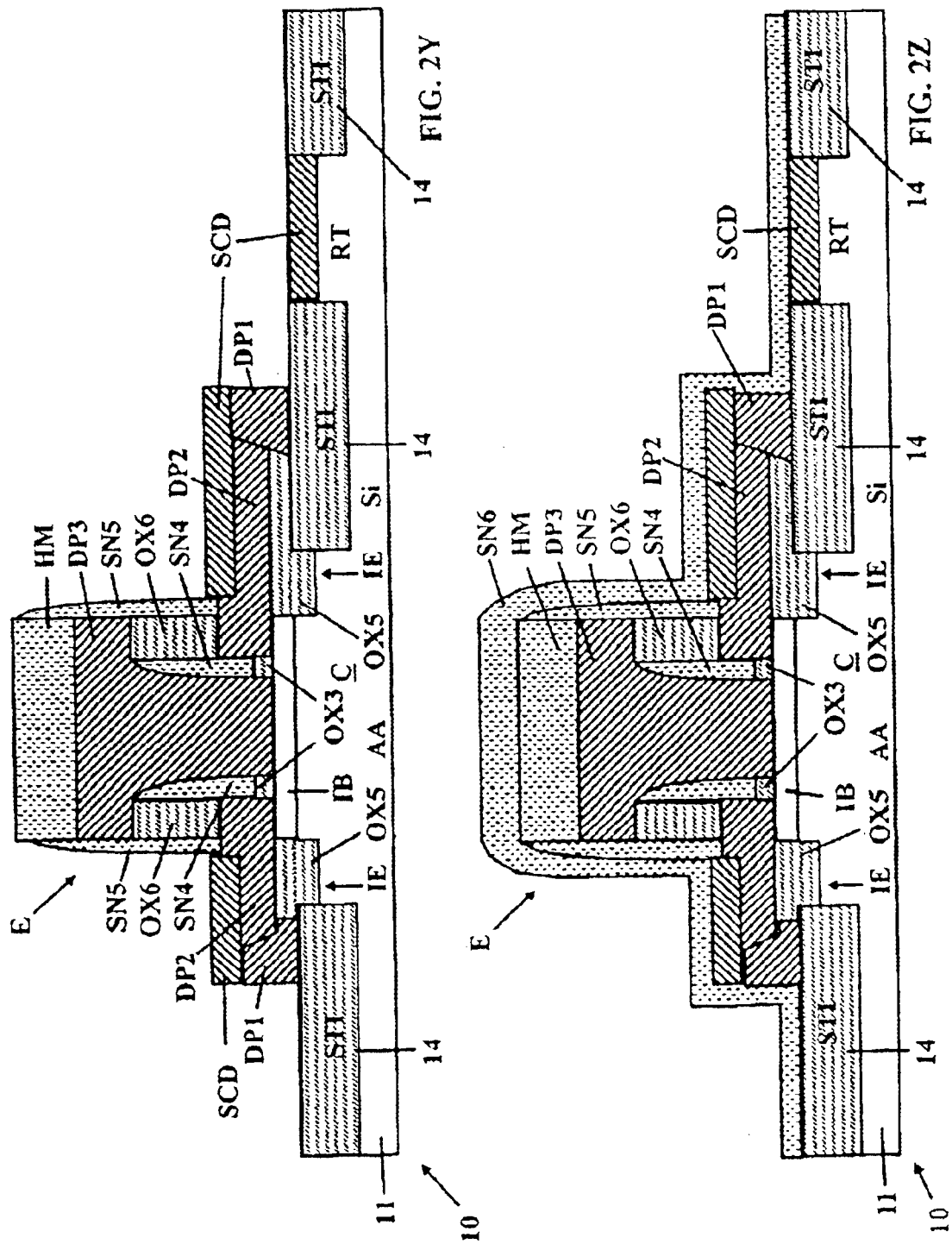

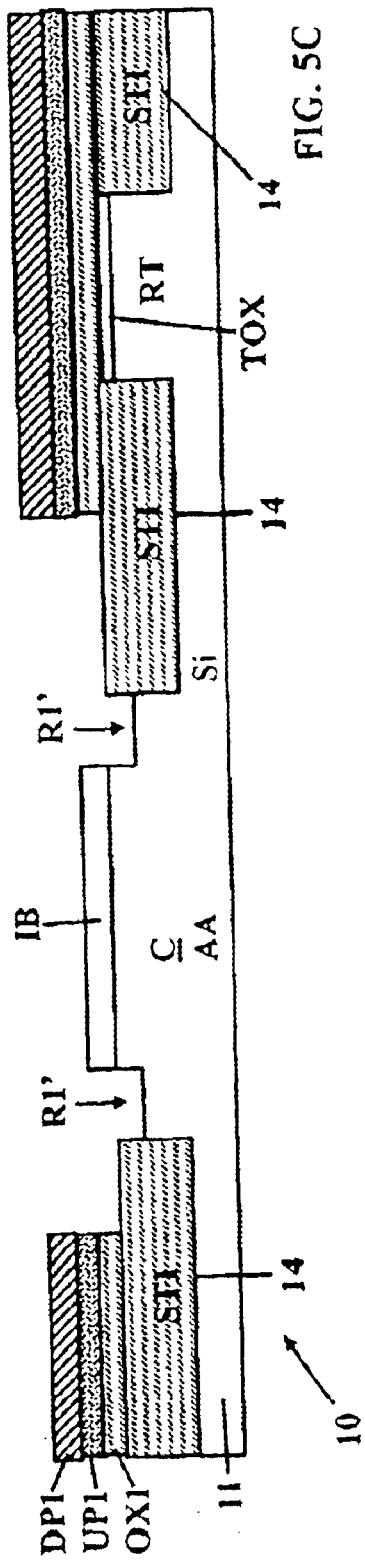
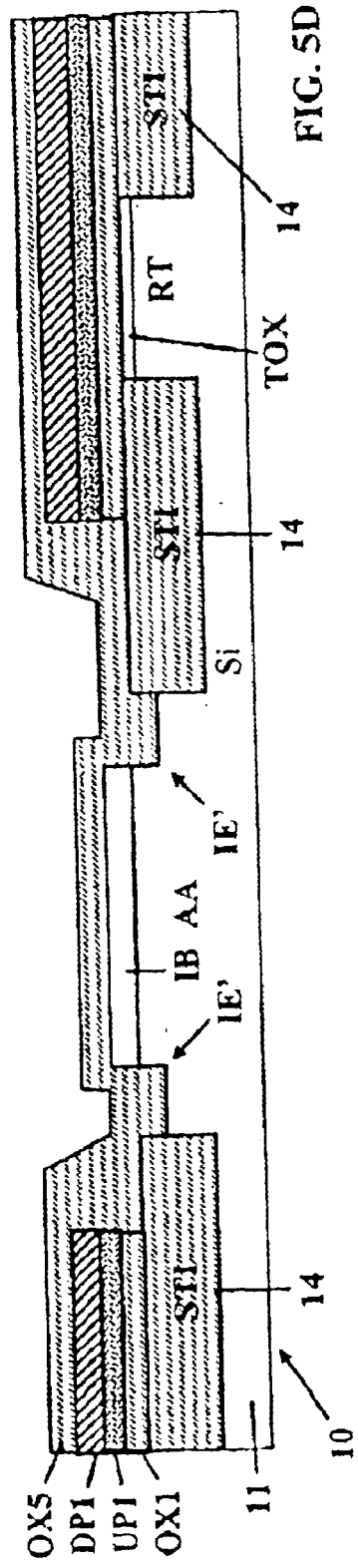

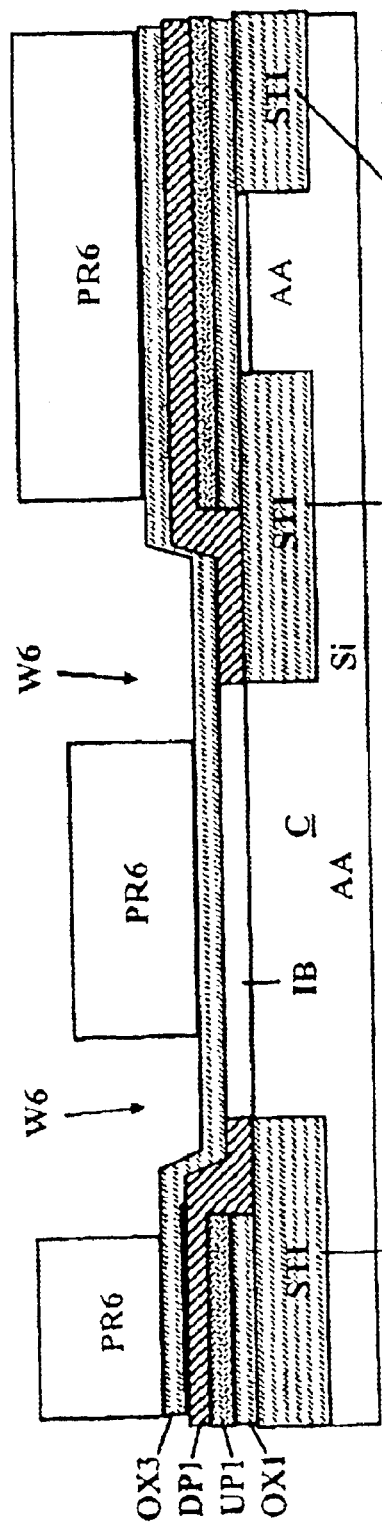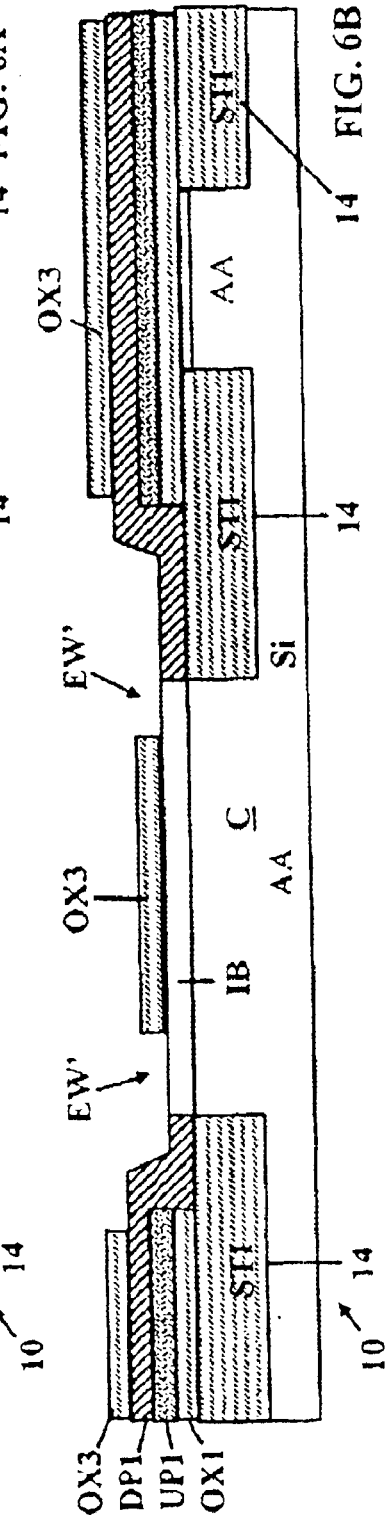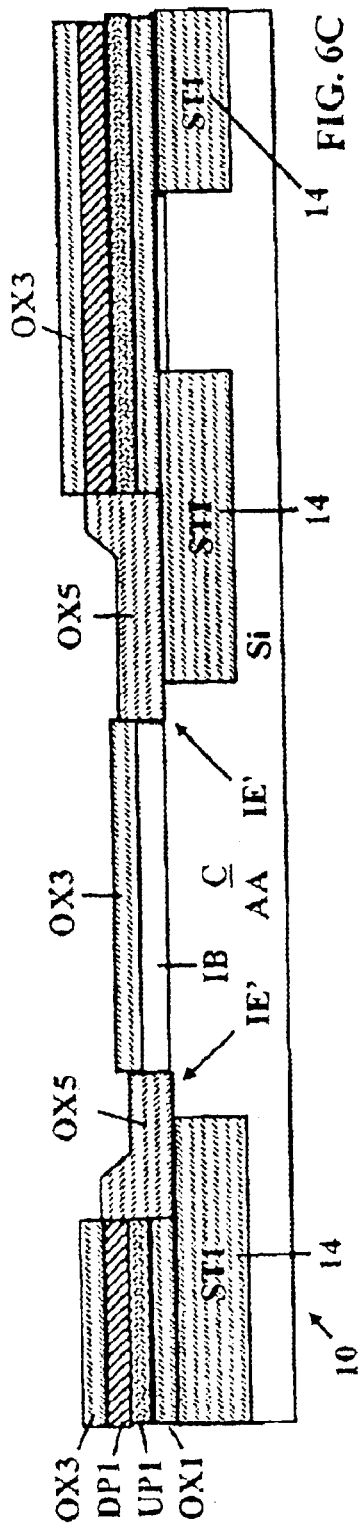

BIPOLAR TRANSISTOR STRUCTURE WITH A SHALLOW ISOLATION EXTENSION REGION PROVIDING REDUCED PARASITIC CAPACITANCE

BACKGROUND OF INVENTION

This invention relates to bipolar transistor structures, and more particularly structures with reduced parasitic capacitance and methods of manufacture thereof.

FIG. 1 is a cross section of prior art Vertical Bipolar Transistor formed on a silicon semiconductor substrate. The transistor includes a doped emitter E, a doped collector C and a counterdoped compound base, in accordance with conventional bipolar device design. The collector C is formed between a pair of Shallow Trench Isolation (STI) (dielectric) regions in the surface of the silicon semiconductor substrate. The compound base comprises an intrinsic silicon (Si) or silicon-germanium (Si—Ge) base region and an extrinsic base region thereabove. The doped intrinsic base region, overlies the collector C and enclosed by the emitter area is in mechanical and electrical contact with the collector and emitter regions. The extrinsic base region overlies the outer surfaces of the intrinsic base region and portions of the STI regions. The emitter region is formed above the intrinsic base and is separated from the extrinsic base by dielectric regions. The Base-to-Collector Capacitance (Ccb) of the device is the sum of the components between (1) the base and the collector inside the active area (defined by the emitter opening) (2) the base and the collector outside the active area, but inside the STI edge (3) the base and the collector across the STI region.

Cut-off frequency (fT) and maximum oscillation frequency (fmax) are the most representative measures of operation speed for high-speed transistors. Hence, the design and optimization efforts for the high-speed transistors are mostly directed toward the maximization of these two parameters. One of the device parameters that influences the cut-off frequency (fT) and maximum oscillation frequency (fmax) is the Base-to-Collector capacitance (Ccb). The value of fT decreases with increasing Ccb as a result of increasing RC delay (charging time) associated with emitter and collector resistances and device transconductance. The impact of Ccb on fmax is even larger as fmax is more sensitive to RC delay associated with Ccb. Overall, the device component (resistance and capacitance) that has the largest impact on fT and fmax, or device operation speed, is Ccb. Therefore, the most effective way to improve device speed through parasitic component reduction is the minimization of extrinsic component of Ccb.

The extrinsic component, or parasitic component, of Ccb comprises more than half of the total Ccb for most conventional bipolar transistors. This parasitic capacitance results from the overlap between the collector and base (intrinsic and extrinsic) regions outside the active transistor area and extending over the shallow trench isolation (STI). The overlap between these regions can not be minimized by lithography due to limitation of overlay and alignment tolerances imposed by the requirement to minimize dimensions and increase the density of devices on the substrate. Moreover, the parasitic capacitance is further increased by the diffusion of the dopants from the base region to the collector region. Therefore, structural optimization of the device which would reduce the parasitic component is a key for the improvement of fT and fmax (i.e. the operation speed of the device).

U.S. Pat. No. 5,599,723 Sato Feb. 4, 1997 entitled "Method for Manufacturing Bipolar Transistor Having Reduced Base-Collector Parasitic Capacitance" teaches use of SiGe for the base, and that the parasitic capacitance formed between the collector epitaxial layer and the base electrode single crystal silicon film is reduced because the distance between them is set to about 1000 Å. In order to reduce the parasitic capacitance by the prior art technique, the intrinsic base must be thickened, and thus the cut-off frequency $f_T$ is lowered. A single crystal form of silicon formed by the selective epitaxial growth is used for the base electrode to reduce the parasitic capacitance between the base and the collector, particularly by forming the base of SiGe. The entire device including the collector regions is formed above the surface of the silicon semiconductor substrate. The approach to reducing the parasitic capacitance is to use selective epitaxy to grow the intrinsic base.

U. S. Pat. No. 5,128,271 of Bronner et al. entitled "High Performance Vertical Bipolar Transistor Structure via Self-aligning Processing Techniques" describes a self-aligned, vertical bipolar transistor structure and a method of manufacturing such a structure with "reduced parasitic base collector capacitance" achieved by providing correct alignment. The Bronner et al. approach has similarities with the present approach to solution of the parasitic base collector capacitance problem. However, the approach of this invention has significant features not described in the Bronner et al. patent. The present invention decouples the primary STI formation from the self-aligned shallow isolation extension (or secondary shallow isolation) formation to reduce the parasitics. This major difference allows a robust manufacturing process and flexible device performance tailoring in many ways some of which are listed below:

(1) The present invention approach is more compatible with CMOS device fabrication for manufacturing BiCMOS technology, where the STI and the shallow isolation extension are formed independently.

(2) The present invention allows the use of different dielectric material(s), than that used to form the STI, to form the shallow isolation extension to further reduce the capacitance.

(3) The present invention utilizes the STI portion exposed to end-point of the RIE of the intrinsic base and as a self-aligning edge to extend the RIE into the collector pedestal.

(4) The present invention allows partial removal of the collector pedestal, which can be employed to tailor the collector pedestal shape within the STI.

(5) The present invention employs a raised extrinsic base and does not require the partial removal of the STI silicon oxide to form the extrinsic base.

SUMMARY OF INVENTION

In accordance with this invention, a structural modification is provided to reduce the parasitic component of Ccb in bipolar transistors with minimum adverse effect on other parameters. More specifically, the excess overlap region between the collector and the base is partially removed and filled with a dielectric prior to forming the extrinsic base region. The dielectric separates the collector and extrinsic base and acts as a barrier for dopant diffusion to reduce the parasitic component of Ccb. The parasitic component of Cbc in typical silicon based bipolar transistors is the result of the existence of depletion region of base-collector P—N junction formed at the extrinsic part of the devices. In accordance with this invention, the parasitic capacitance in such transistors is reduced by employing materials with reduced dielectric constants in the depletion region, since silicon has a high dielectric constant.

In accordance with this invention a structure and methods are provided whereby the silicon depletion region is partially or entirely replaced with a dielectric material with a low dielectric constant. One choice of dielectric is silicon oxide, dielectric constant of which is only 33% of silicon, which reduces the capacitance significantly.

In accordance with this invention, a bipolar vertical transistor is formed in a silicon semiconductor substrate which has an upper surface with STI regions formed therein composed of a dielectric material formed in the substrate having inner ends and top surfaces. A doped collector region is formed in the substrate between a pair of the STI regions. A counterdoped intrinsic base region is formed on the upper surface of the substrate between the pair of the STI regions with a margin between the intrinsic base region and the pair of STI regions, the intrinsic base region having edges. A doped emitter region is formed above the intrinsic base region spaced away from the edges. A shallow isolation extension region composed of a dielectric material is next to the edges of the intrinsic base region formed in the margin between the STI regions and the intrinsic base region. An extrinsic base region covers the shallow isolation extension region and extends partially over the intrinsic base region in mechanical and electrical contact therewith, whereby the shallow isolation extension region reduces the base-to-collector parasitic capacitance of the bipolar transistor. In accordance with another aspect of this invention, the shallow isolation extension region is either self-aligned with the emitter; or the shallow isolation extension region is non self-aligned with the emitter.

Preferably, the shallow isolation extension region is formed of an oxide material selected the group consisting of oxidized-doped-silicon and a deposited silicon oxide. Preferably the shallow isolation extension region is formed of a material having a lower dielectric constant than the STI regions, the shallow isolation extension region overlaps the inner ends and top surfaces of the STI regions. Preferably the shallow isolation extension region extends beneath the edges of the base region. Preferably the intrinsic base region is composed of a material selected from the group consisting of doped crystalline silicon and silicon germanium. Preferably the isolation extension region extends into the doped collector region thereby modifying the resistance of the collector region.

In accordance with another aspect of this invention, a bipolar vertical transistor is formed in a silicon semiconductor substrate which has an upper surface and STI regions are formed therein composed of a dielectric material and having inner ends and top surfaces. A doped collector region is formed in the substrate between a pair of the STI regions. A counterdoped intrinsic base region is formed on the upper surface of the substrate between the pair of STI regions with a margin between the intrinsic base region and the pair of STI regions, the intrinsic base region having edges. The intrinsic base region is composed of a material selected from the group consisting of doped crystalline silicon and silicon germanium. A doped emitter region formed composed of doped polysilicon is formed above the intrinsic base region spaced away from the edges thereof. A shallow isolation extension region composed of a dielectric material is juxtaposed with the edges of the intrinsic base region formed in the margin between the STI regions and the intrinsic base region and overlapping the inner ends and top surfaces of the STI regions. An extrinsic base region covers the shallow isolation extension region and extends partially over the intrinsic base region in mechanical and electrical contact therewith. A silicon nitride cap is formed over the emitter region and silicon nitride sidewall spacers formed on sidewalls of the emitter region, whereby the shallow isolation extension region reduces the base-to-collector parasitic capacitance of the bipolar transistor.

Preferably, the shallow isolation extension region is self-aligned with the emitter, or alternatively the shallow isolation extension region is non self-aligned with the emitter. The shallow isolation extension region is formed of an oxide of the substrate. The shallow isolation extension region is formed of a material having a lower dielectric constant than the STI regions. The shallow isolation extension region extends beneath the edges of the base region.

In accordance with another aspect of the invention, a method of forming a bipolar vertical transistor is formed in a silicon semiconductor substrate having an upper surface includes forming STI regions composed of a dielectric material formed in the substrate having inner ends and top surfaces. The steps are performed including forming a doped collector in the substrate between a pair of the STI regions, forming a counterdoped intrinsic base region formed on the upper surface of the substrate between the pair of the STI regions with a margin between the intrinsic base region and the pair of STI regions, with the intrinsic base region having edges, and forming a doped emitter region above the intrinsic base region spaced away from the edges. The shallow isolation extension region is composed of a dielectric material juxtaposed with the edges of the intrinsic base region formed in the margin between the STI regions and the intrinsic base region. The method also includes forming an extrinsic base region covering the shallow isolation extension region and extending partially over the intrinsic base region in mechanical and electrical contact therewith, whereby the shallow isolation extension region reduces the base-to-collector parasitic capacitance of the bipolar transistor.

Preferably, the shallow isolation extension region is formed by a method selected from the group consisting of oxidation or RIE to form an isolation extension recess and then filling the isolation extension recess with a dielectric material. The shallow isolation extension region is self-aligned with the emitter or the shallow isolation extension region is non self-aligned with the emitter.

Preferably, the method includes forming of the shallow isolation extension region includes overlapping the inner ends and top surfaces of the STI regions, forming a thermal oxide layer upon the substrate, forming Shallow Trench Isolation (STI) regions in the substrate defining an active area, and a collector reachthrough area aside from the active area. Preferably, the method also includes forming a first silicon nitride layer over the active area, forming a stack of a first silicon oxide layer, a first undoped polysilicon layer and a second silicon oxide layer aside from the first silicon nitride layer, covering the collector reachtrhough area and partially covering the STI regions, stripping the first silicon nitride layer, forming an intrinsic base epitaxial layer over the active area, and forming a sacrificial emitter stack of a third silicon oxide layer, a second undoped polysilicon layer and a second silicon nitride layer centrally over a portion of the active area leaving exposed portions thereof on each side of the sacrificial emitter stack.

BRIEF DESCRIPTION OF DRAWINGS

The foregoing and other aspects and advantages of this invention are explained and described below with reference to the accompanying drawings, in which:

FIG. 1 shows a cross section of prior art Vertical Bipolar Transistor formed on a silicon semiconductor substrate.

FIGS. 5A–5D show sectional views of the processing steps of a device 10C that is a modification of the process of FIGS. 2A–2AB employing a non-self-aligned technique to form the isolation extension.

FIGS. 6A–6C show sectional views of the processing steps of a device that is a variation of the process of FIGS. 5A–5D with the isolation extension formed by oxidation.

DETAILED DESCRIPTION

Figure 2A:
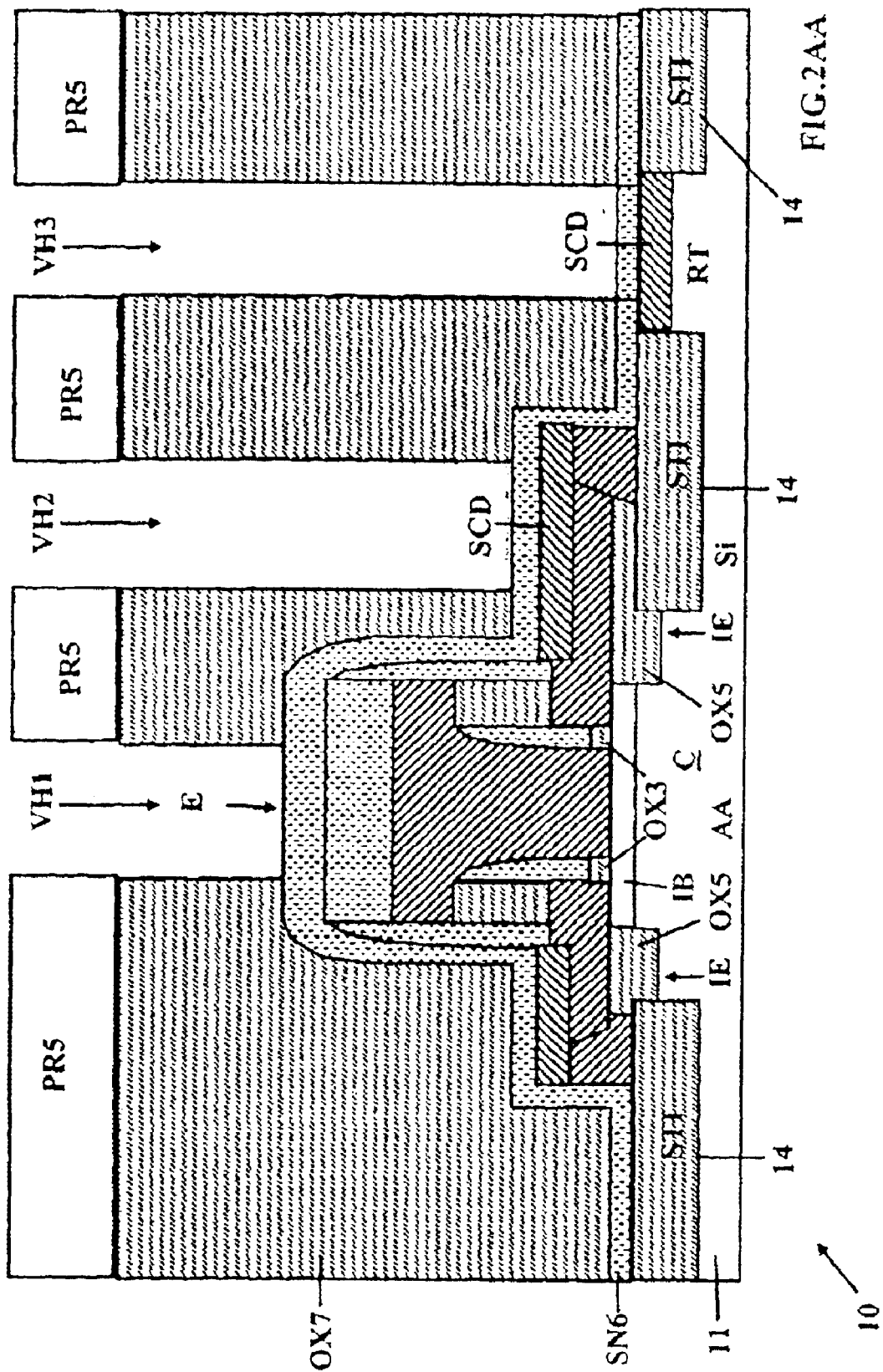
FIGS. 2A–2AB are sectional views illustrating the process of manufacturing of a device in accordance with this invention employing a self-aligned technique to form the isolation extension.
Figure 2A:
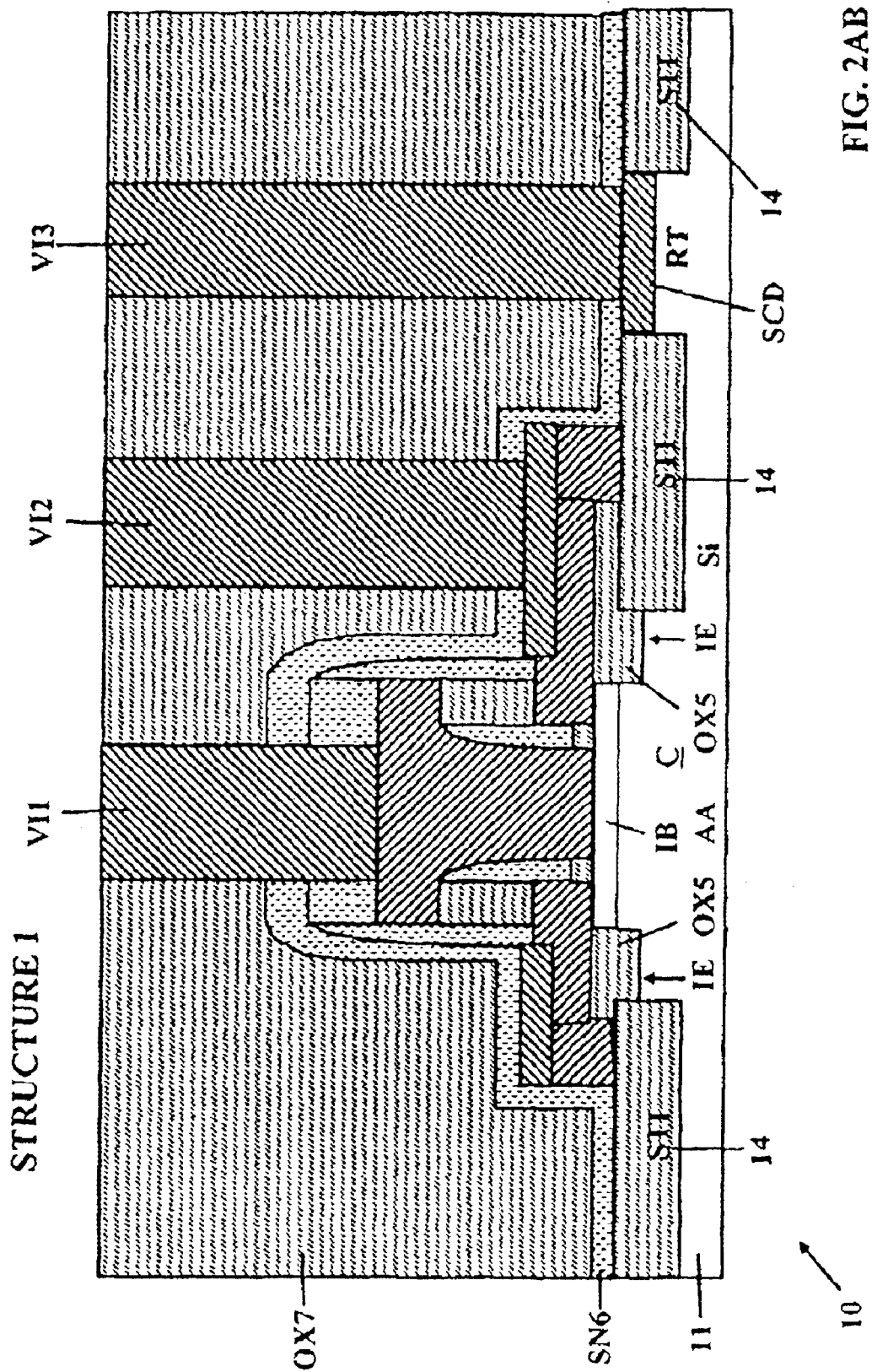

FIGS. 2A–2AB are sectional views illustrating the process of manufacturing of a device 10 in accordance with this invention.

FIG. 2A is a sectional view of the device 10 in an early stage in the manufacturing process. Device 10 includes a doped silicon semiconductor substrate 11 which has been coated with a thin thermal oxide layer TOX in accordance with a conventional process.

N-doped Collector Pedestal Formation

FIG. 2B shows the device 10 of FIG. 2A after a set of recesses have been formed in the surface of the substrate 11. The recesses have been filled with shallow trench isolation (STI) regions 14 a dielectric material comprising silicon oxide. The STI regions 14 have been formed in the substrate 11 to define the silicon active area AA, the collector region C and the collector reachthrough region RT therebetween. The STI regions 14 have inner sidewalls, i.e. inner ends, juxtaposed with the central portion of the collector region C and top surfaces. The active area AA and the reachthrough region RT are located below the thin thermal oxide layer TOX which remains between the STI regions 14. The STI regions 14 comprise any form of silicon oxide formed by a process selected from the group of processes including PECVD, RTCVD, OZONE TEOS, LPCVD. In the case of an NPN bipolar transistor, the active area AA which includes the collector region C of the transistor is doped with N type dopant by ion implantation or in-situ doped epitaxial growth, as will be well understood by those skilled in the art. The collector region C is located in the substrate, up to the surface thereof, as shown in FIG. 2B.

FIG. 2C shows the device 10 of FIG. 2B after blanket deposition of a thin, protective, first silicon nitride layer SN1 followed by formation of a first photoresist mask PR1 with windows W1/W1' therethrough aside from the active area AA to prepare for patterning the thin, protective, first silicon nitride layer SN1 over the active area AA in the silicon substrate 11.

FIG. 2D shows the device 10 of FIG. 2C after etching of the portions of the thin, protective, first silicon nitride layer SN1 aside from the active area AA, exposing portions of the surfaces aside of the STI regions 14 aside from the active area AA and the thermal oxide layer TOX above the reachthrough region RT. Then the first photoresist mask PR2 was stripped away leaving the portion of thin, protective, first silicon nitride layer SN1 above the active area AA and portions of the adjacent STI regions 14 intact.

FIG. 2E shows the device 10 of FIG. 2D after deposition of a stack of conformal, thin films of silicon oxide OX1, undoped polysilicon UP1 and a second silicon oxide layer OX2, and a second patterning photoresist mask PR2 is formed with a central window W2 therethrough extending beyond the edges of the remainder of the underlying first silicon nitride layer SN1 to form an opening to be used for epitaxial growth of an intrinsic base region.

FIG. 2F shows the device 10 of FIG. 2E after an RIE etching step removing the exposed silicon oxide OX1/undoped polysilicon UP1/silicon oxide OX2 stack stopping on the first silicon nitride layer SN1. Then second photoresist mask PR2 is stripped away from device 10.

FIG. 2G shows the device 10 of FIG. 2F after stripping the first silicon nitride layer SN1 with a wet etching process, i.e. hot phosphoric acid followed by the etching away of the thermal oxide layer TOX and the exposed second silicon oxide layer OX2 with a wet etchant, i.e. HF acid.

FIG. 2H shows the device 10 of FIG. 2G after epitaxial growth of an intrinsic base layer IB directly over the exposed surface of the monocrystalline active area AA combined with simultaneous formation of a first doped polycrystalline silicon layer DP1 over the STI regions 14 and the remaining stack of the first undoped polysilicon UP1 and the first silicon oxide layer OX1. The intrinsic base IB and the doped polysilicon layer DP1 are deposited by Low Temperature Epitaxy (LTE) forming P-doped intrinsic base layer IB composed of P-doped crystalline semiconductor silicon (Si) or silicon-germanium (Si—Ge) intrinsic base region directly on the top surface of on the silicon substrate 11 directly above the active area AA which will comprise the collector region C of the vertical transistor. The LTE process that deposits the intrinsic base layer IB over the active area AA in the silicon substrate 11 also simultaneously forms a first P-doped polycrystalline silicon layer DP1.

FIG. 2I shows the device 10 of FIG. 2H after deposition of a stack of conformal layers comprising a third silicon oxide layer OX3/second undoped polysilicon UP2/second silicon nitride/SN2 over the device 10 covering the intrinsic base IB and the first doped polysilicon layer DP1.

Next, a third photoresist mask PR3 with windows W3 therethrough aside from the location where an emitter pedestal EP is to be formed (as shown in FIG. 2J) is patterned to form an emitter pedestal and a raised extrinsic base region in subsequent steps.

FIG. 2J shows the device 10 of FIG. 2I after an RIE etch through the windows W3 in mask PR3 of top layers of the stack added in FIG. 2I including the second silicon nitride layer SN2 and the undoped polysilicon layer UP2. Next, the third photoresist mask PR3 was stripped. The etch stops on the third silicon oxide layer OX3 forming a raised extrinsic base region RER on either side of an emitter pedestal EP which is centered over active area AA.

FIG. 2K shows the device 10 of FIG. 2J after the formation of silicon nitride sidewall spacers SN3 on the sides of the emitter pedestal EP and the stacks aside from the raised extrinsic base regions RER thereby covering exposed sidewalls of the second silicon nitride layer SN2 and the undoped polysilicon UP2.

FIG. 2L shows the device 10 of FIG. 2K after the formation of silicon oxide spacers OX4 to provide an extension window EW adapted to be used for the formation of the shallow isolation extension regions IE by the steps indicated by FIGS. 2M, 2N and 2O in a self-aligned manner with respect to the emitter pedestal EP. The spacers OX4 are used as a hard mask while using RIE to etch the exposed doped silicon DP1 in the extension window EW to form the shallow isolation extension regions IE and forming isolation extension recesses R1 where the doped silicon DP1 has been etched away as shown in FIG. 2M. The width of spacers OX4 defines and protects the perimeter area around emitter pedestal EP during the RIE to provide a contact area between the intrinsic base IB and the extrinsic base polysilicon DP2 as shown in FIG. 2P.

FIG. 2M shows the device 10 of FIG. 2L after the RIE etch through the exposed intrinsic base IB and doped polysilicon DP1 over the STI and down into the collector region C in the active area AA using the silicon oxide spacers OX4 as a hard mask to form isolation extension recesses R1 around the emitter pedestal EP between the spacers OX4 and the inner sidewalls of the shallow trench STI regions 14 adjacent to the emitter pedestal EP. The result is that the top central portion of the collector region C (which is formed from the substrate 11) have been shaped into an intrinsic base/collector pedestal located centrally between the isolation extension recesses R1. Moreover, the edges of the intrinsic base IB are aligned with the edges of the pedestal portion of the collector region C forming the top layer of the intrinsic base/collector pedestal. Later in the process, the shallow isolation extension regions IE will be formed between the sidewalls of the intrinsic base/collector pedestal by depositing silicon oxide into the isolation extension recesses R1 as shown in FIG. 2O. The width and depth of the isolation extension recesses R1 formed in the collector region C are optimized to reduce the parasitic capacitance. In addition, the isolation extension recesses R1 in the collector region C in the active area AA determines the final collector structure. Consequently, the width and depth of the isolation extension recesses R1 can be optimized to tailor the collector resistance as will be well understood by those skilled in the art. The intrinsic base IB and the high portion of the collector region C are separated from the STI regions by the widths of the isolation extension recesses R1 on either side thereof.

FIG. 2N shows the device 10 of FIG. 2M after deposition of a conformal silicon oxide layer OX5 to fill the isolation extension recesses (or trenches) R1 to prepare for formation of the shallow isolation extension regions IE around the emitter pedestal EP.

FIG. 2O shows the device 10 of FIG. 2N after the oxide layer OX5 has been planarized and etched or recessed down to the intrinsic base IB surface to form the shallow isolation extension regions IE.

FIG. 2L through FIG. 2O show how the shallow isolation extension regions IE are formed independently from the formation of the primary shallow trench isolation STI. This decoupling of the formation of the shallow isolation extension regions IE allows compatibility of the bipolar transistor described herein with conventional CMOS technology to manufacture BiCMOS technology, where the primary shallow trench isolation STI is common to both bipolar and CMOS devices. This decoupling of the formation of the shallow isolation extension regions also allows control over parasitic base-to-collector capacitance reduction through control over the depth of the isolation extension recess R1 and the option of using different materials with different dielectric properties than those of the primary shallow trench isolation STI material. For example, a different material with a lower dielectric constant can be used instead of the silicon oxide layer OX5 to fill the isolation extension recesses R1 to further reduce the parasitic capacitance. Such materials with lower dielectric constant include, but are not limited to, SiLK, fluorinated oxides, and porous oxides.

FIG. 2P shows the device 10 of FIG. 2O after deposition of doped polysilicon layer DP2 followed by planarization and recess to form a raised extrinsic base DP2. FIG. 2P also shows the perimeter contact area between the intrinsic base IB and the extrinsic base doped polysilicon DP2 which was defined and protected by the silicon oxide spacers OX4 as shown in FIG. 2M.

FIG. 2Q shows the device 10 of FIG. 2P after deposition of isolation oxide OX6 followed by planarization and recessing of the isolation oxide OX6 leaving the emitter pedestal EP and the lateral stack of layers SN2/UP2 exposed.

FIG. 2R shows the device 10 of FIG. 2Q after an RIE etch of silicon nitride layer SN2 and undoped polysilicon layer UP2 thereby removing the emitter pedestal EP to make emitter opening EO between the isolation stacks IS which have been formed by the remaining stacks and the doped extrinsic base polysilicon DP2 topped with the isolation oxide OX6. The silicon nitride spacers SN3 are also removed with an RIE or a wet etch and the top surfaces of the third silicon oxide layer OX3 are exposed.

FIG. 2S shows the device 10 of FIG. 2R after forming the final silicon nitride spacers SN4 on the sidewalls of the isolation stacks IS.

FIG. 2T shows the device 10 of FIG. 2S after removal of the exposed portion of the third silicon oxide OX3 at the bottom of the emitter opening EO and the field, thereby exposing the top surface of the intrinsic base IB.

FIG. 2U shows the device 10 of FIG. 2T after depositing a conformal layer of doped emitter polysilicon DP3 followed by deposition of a conformal layer of silicon nitride to serve as a hard mask HM'. A fourth patterned photoresist mask PR4 is formed over the layers DP3/HM to be used to form an emitter E as shown in FIG. 2V. The mask PR4 overlaps the isolation stacks IS.

FIG. 2V shows the device 10 of FIG. 2U after RIE etching of the silicon nitride layer HM' to form the hard mask HM, followed by stripping mask PR4. This is then followed by RIE etching of doped emitter polysilicon DP3, doped polysilicon DP1 (aside from silicon nitride spacers SN4) and undoped polysilicon UP1 to form the emitter E and to expose the collector reach-through region RT.

FIG. 2W shows device 10 of FIG. 2V after stripping the isolation silicon oxide OX6 over the doped extrinsic base polysilicon DP2 and the outer portions of silicon nitride spacers SN4 and the outer portions of third silicon oxide layer OX3 over doped polysilicon DP1.

FIG. 2X shows the device 10 of FIG. 2W after formation of silicon nitride spacers SN5 on the sidewalls of the emitter stack E.

FIG. 2Y shows the device 10 of FIG. 2X after formation of a layer of a silicide SCD over exposed extrinsic base DP2 and collector reachthrough region RT by a process well known to those skilled in the art of silicidation of polysilicon surfaces.

FIG. 2Z shows the device 10 of FIG. 2Y after depositing a thin conformal layer of silicon nitride layer SN6 over the entire device.

FIG. 2AA shows the device 10 of FIG. 2Z after deposition of a thick blanket layer of silicon oxide OX7 over device 10 covering the conformal silicon nitride layer SN6. The silicon oxide layer OX7 has been planarized to form contacts. Then a patterned layer of photoresist PR5 was applied with openings to via holes VH1, VH2, VH3 therethrough to form contacts to the Emitter E, the base silicide SCD over the extrinsic base DP2, and the collector region C via the reachthrough RT to the substrate 11. The vias VH1–VH3 are formed by RIE etching the silicon oxide layer OX7, followed by stripping the photoresist PR5.

FIG. 2AB shows the device 10 of FIG. 2AA after the conformal silicon nitride layer SN6 and the silicon nitride hard mask HM above the emitter are RIE etched and the via metal contacts VI1, VI2 and VI3 are formed by deposition and planarization of a metal layer.

Figure 3:
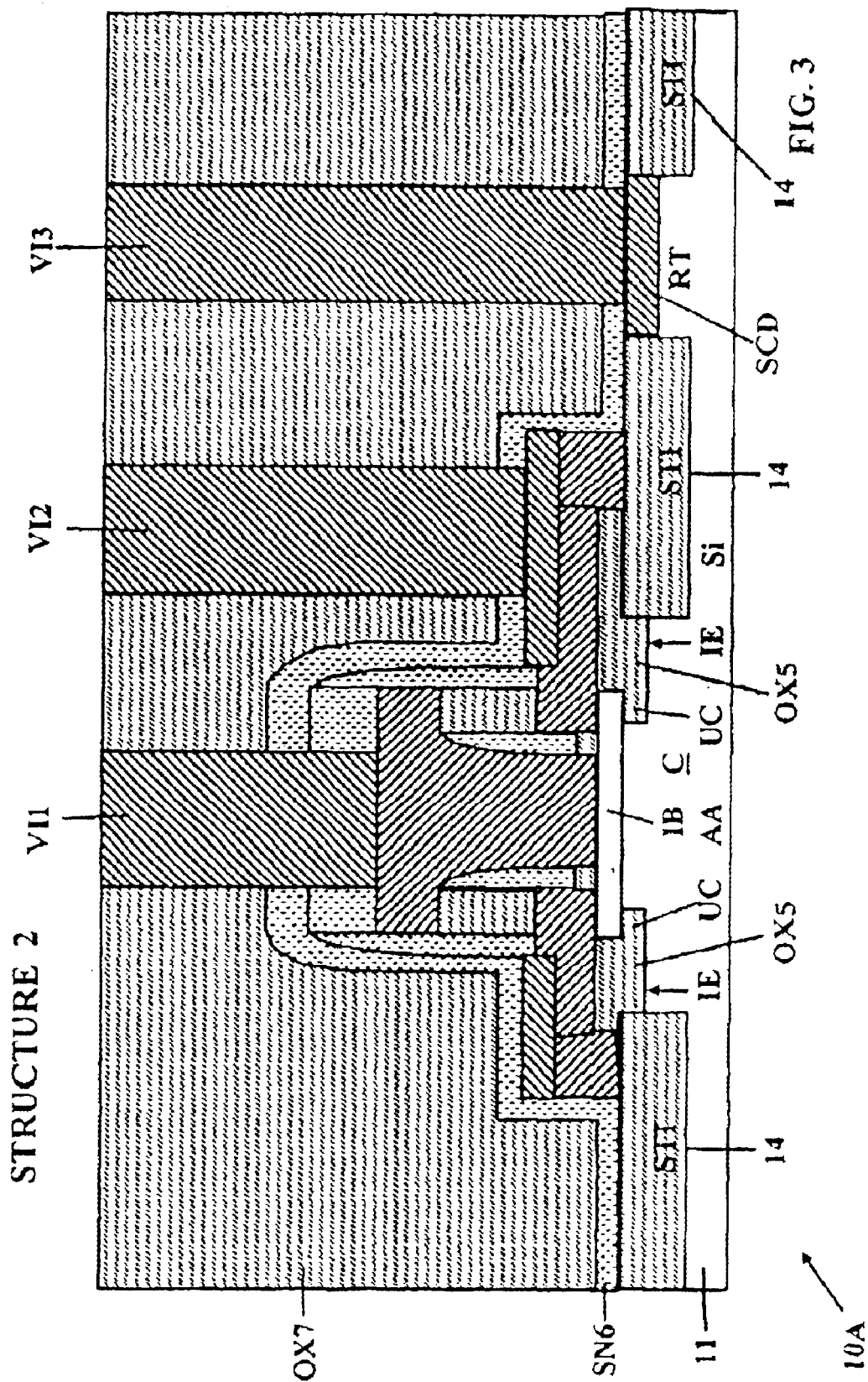
FIG. 3 shows a device which is a variation of the device of FIG. 2AB with the isolation extension extending below the epitaxial part of the extrinsic base.

FIG. 3 shows a device 10A which is a variation of device 10 of FIG. 2AB. This structure is created the same way as the structure of FIG. 2AB with the exception that the collector region C in the active area AA of silicon substrate 11 is further etched by wet or RIE chemistries to form undercuts UC of the intrinsic base IB. This can be implemented in the process flow shown in FIG. 2A through FIG. 2AB at the step shown in FIG. 2M by etching the collector region C in the active area AA to form an undercut UC that reaches underneath the intrinsic base region IB with an extra isotropic etch. Such an undercut UC can be accomplished by using isotropic RIE and/or wet etch chemistries that have high selectivity between the collector region C in the active area AA and the intrinsic base IB based on doping type, concentration and material type. For example, in the case of a heterojunction bipolar transistor with a silicon-germanium (SiGe) base and a silicon collector, a wet etch with ammonium hydroxide ($HN_4OH$) can be used, which has a high etch selectivity of silicon to silicon-germanium. The width, depth and undercut of the isolation extension recesses R1 into the collector region C in the active area AA are optimized to reduce the parasitic capacitance. In addition, the isolation extension recesses R1 in the collector region C determines the final collector structure. Consequently, the width, depth, and undercut of the isolation extension recesses R1 can be optimized to tailor the collector resistance, as will be well understood by those skilled in the art.

Figure 4:
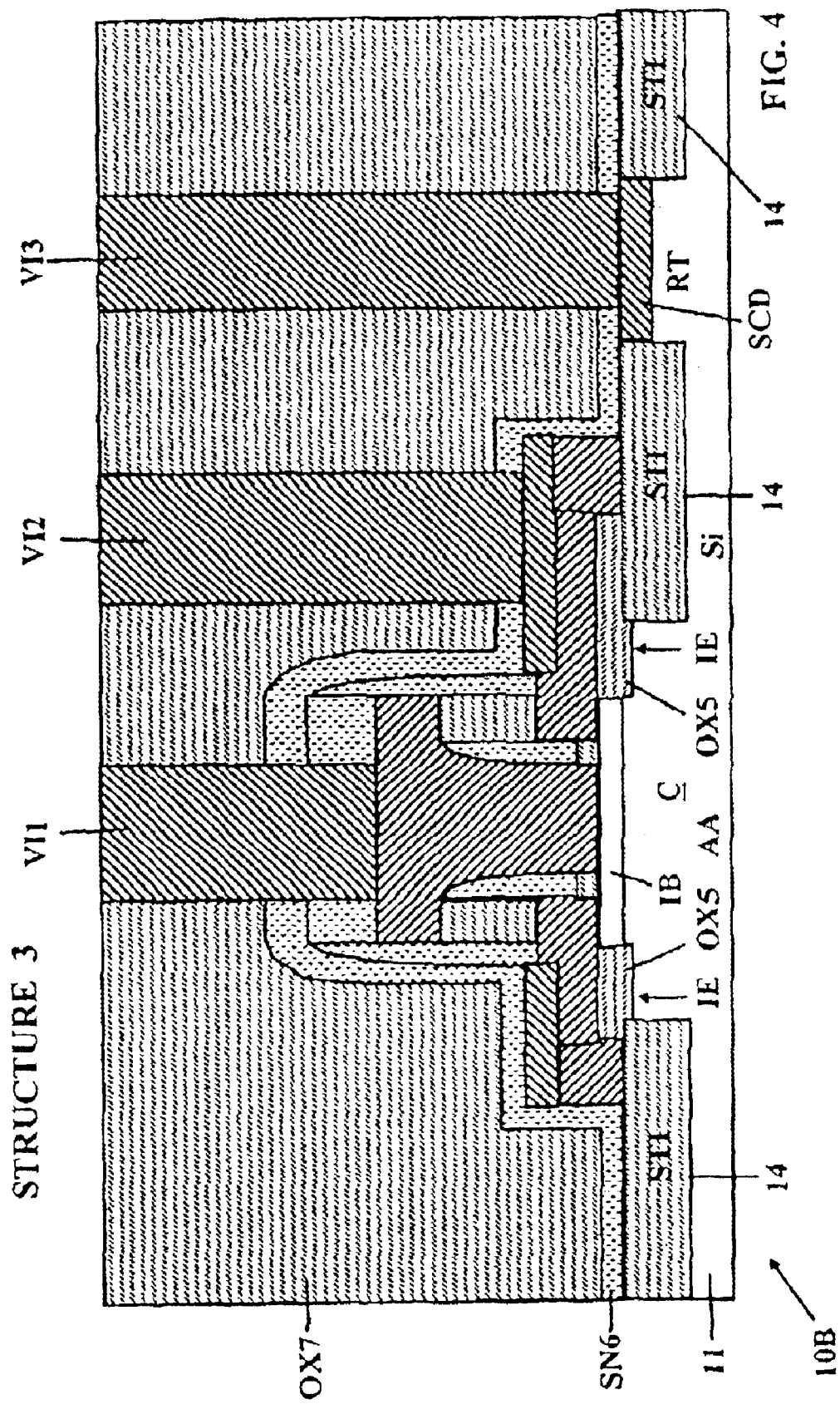
FIG. 4 shows another variation of the device of FIG. 2AB with the isolation extension formed by oxidation.

FIG. 4 shows a device 10B which is another variation of the device 10 of FIG. 2AB. This structure is created the same way as structure of FIG. 2AB with the exception that the exposed portions of the intrinsic base IB and the doped polysilicon DP1 over the shallow trench isolation STI in FIG. 2L are oxidized to form the isolation extension region IE. In this case, the process flow steps after FIG. 2L are skipped to the step in FIG. 2P.

FIGS. 5A–5D show cross-sectional views of modified steps of the process shown in FIGS. 2A–2AB to form the shallow isolation extension IE in a non-self aligned manner in making devices 10 and 10A shown in FIG. 2AB and FIG. 3. The mask PR6 is used to define and expose the region of the intrinsic base IB and the first doped polysilicon DP1 over the primary shallow trench isolation to form the shallow isolation extension region IE prior to forming the emitter pedestal EP. The process steps in FIGS. 5A–5B replace the processing steps of FIGS. 2L–2O.

Figure 5A:
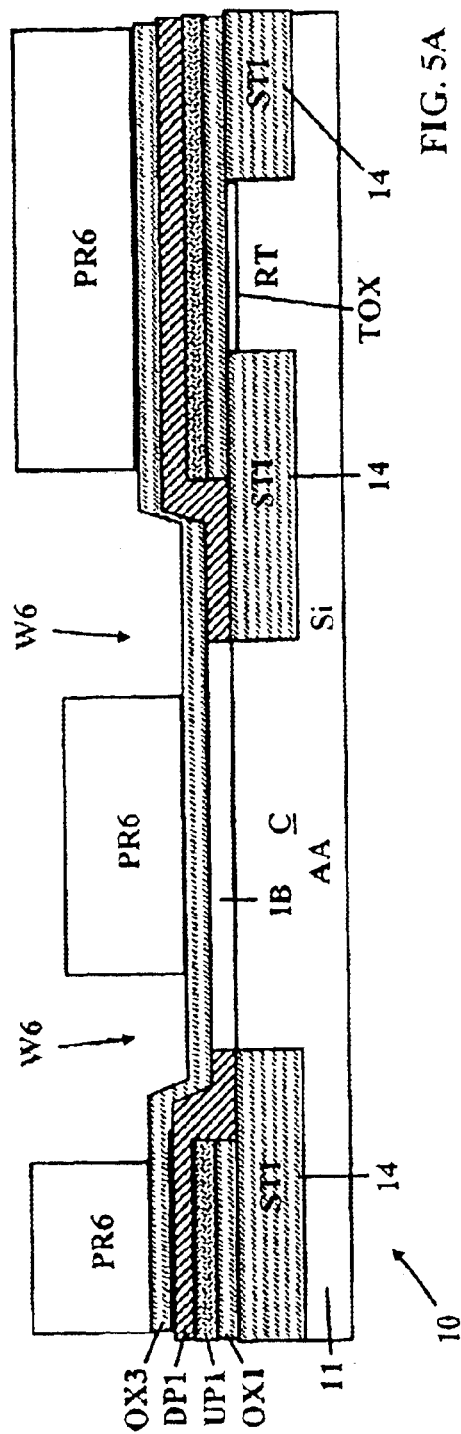

FIG. 5A shows the device 10 of FIG. 2H after deposition of silicon oxide layer OX3 over the device 10 covering the intrinsic base IB and the first doped polysilicon layer DP1. Next a photoresist mask PR6 with windows W6 through it is patterned to form the shallow isolation extension region IE in subsequent steps.

Figure 5B:
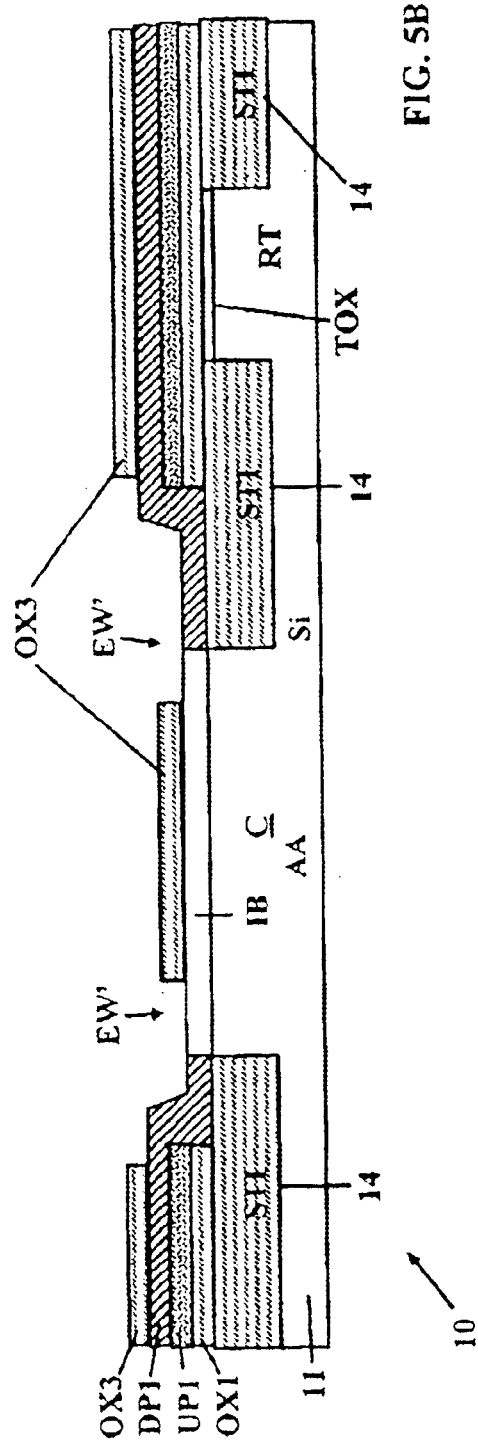

FIG. 5B shows device 10 of FIG. 5A after an RIE etch through window W6 in mask PR6 through the silicon oxide layer OX3 to form the extension window EW'. The etch stops on the region of the intrinsic base IB while exposing the right and left edges of the intrinsic base IB, and first doped polysilicon layer DP1 to be RIE etched to form the isolation extension IE. Next the photoresist mask PR6 is stripped. The width of the silicon oxide OX3 portion inside the extension window EW' defines and protects the emitter pedestal EP area and a perimeter area around the emitter pedestal EP to provide a contact area between the intrinsic base IB and the extrinsic base polysilicon DP2 (shown in FIG. 2P) during the RIE etch.

FIG. 5C shows the device 10 of FIG. 5B after the RIE etch through the exposed intrinsic base IB and doped polysilicon DP1 over the STI and down into the collector region C in the active area AA using the silicon oxide OX3 as a hard mask. This forms the isolation extension recesses R1' between the intrinsic base IB and the shallow trench isolations STI.

FIG. 5D shows the device 10 section of FIG. 5C after the silicon oxide OX3 was removed with wet etch and a conformal silicon oxide layer OX5 was deposited to fill the isolation extension recesses (or trenches) R1' to form the isolation extension regions IE'. The process flow then proceeds from the step in FIG. 2I and the steps in FIGS. 2L–2O are skipped to create devices 10 and 10A shown in FIGS. 2AB and 3.

FIGS. 6A–6C show cross-sectional views of a variation of the process shown in FIGS. 5A–5D to form the shallow isolation extension IE in a non-self aligned manner in making device 10B shown in FIG. 4 using the same mask PR6 as in FIG. 5A. The mask PR6 is used to define and expose the region of the intrinsic base IB and the first doped polysilicon DP1 over the primary shallow trench isolation to form the shallow isolation extension region IE prior to forming the emitter pedestal EP. The process steps in FIGS. 6A–6C replace the processing steps of FIGS. 2L–2O. FIG. 6A shows the device 10 of FIG. 2H after deposition of silicon oxide layer OX3 over the device 10 covering the intrinsic base IB and the first doped polysilicon layer DP1. Next a photoresist mask PR6 with windows W6 therethrough is patterned to form the shallow isolation extension region IE in subsequent steps.

FIG. 6B shows the device 10 of FIG. 6A after an RIE etch through the window W6 in mask PR6 through the silicon oxide layer OX3 to form the extension window EW'. The etch stops on the region of the intrinsic base IB and first doped polysilicon layer DP1 to be oxidized to form the isolation extension IE. Next the photoresist mask PR6 was stripped. The width of the silicon oxide OX3 portion inside the extension window EW'. defines and protects the emitter pedestal EP area and a perimeter area around the emitter pedestal EP to provide a contact area between the intrinsic base IB and the extrinsic base polysilicon DP2 (shown in FIG. 2P) during oxidation.

FIG. 6C shows the device 10 of FIG. 6B after the exposed portions of the intrinsic base IB and the doped polysilicon DP1 over the shallow trench isolation STI in FIG. 6B are oxidized to form the isolation extension region IE'. The process flow then proceeds from the step in FIG. 2I and the steps in FIGS. 2L–2O are skipped to create device 10B shown in FIG. 4.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A bipolar vertical transistor formed in a silicon semiconductor substrate comprising:
   said silicon semiconductor substrate having an upper surface,
   shallow trench isolation (STI) regions composed of a dielectric material formed in said upper surface of said silicon semiconductor substrate,
   said STI regions having inner sidewalls and top surfaces,
   a doped collector region formed completely within said substrate between a pair of said STI regions below said top surface of said silicon semiconductor substrate, so that said doped collector region has a top surface which comprises said upper surface of said silicon semiconductor substrate,
   an intrinsic base pedestal comprising a counterdoped intrinsic base region formed directly on said upper surface of said silicon semiconductor substrate on top of said collector region between said inner ends of said pair of said STI regions with a margin between said intrinsic base region and said pair of said STI regions, said intrinsic base pedestal having edges,
   a lateral isolation extension recess formed extending to a depth at least between said lateral edges of said intrinsic base pedestal and said inner sidewalls of said pair of STI regions, or extending between said inner sidewalls of said pair of said STI regions and said lateral edges of said intrinsic base pedestal as well as extending between said inner sidewalls of said pair of said STI regions and lateral edges of a top portion of said collector region,
   said lateral isolation extension recess separating at least said intrinsic base pedestal from said pair of STI regions,
   a doped emitter region formed above said intrinsic base region spaced away from said edges of said intrinsic base-collector pedestal, and
   a shallow isolation extension region composed of a dielectric material juxtaposed with said edges of said intrinsic base pedestal formed in said lateral isolation extension recess in said margin between at least said inner ends of said pair of said STI regions and said edges of said intrinsic base pedestal, or said shallow isolation extension region extending between both said inner sidewalls of said pair of STI regions and said lateral edges of said intrinsic base pedestal and said shallow isolation extension region extending between said inner sidewalls of said pair of said STI regions and lateral edges of a top portion of said collector region,
   whereby said shallow isolation extension region reduces the base-to-collector parasitic capacitance of said bipolar transistor.

2. The transistor of claim 1 wherein said shallow isolation extension region is aligned with said emitter.

3. The transistor of claim 1 wherein said shallow isolation extension region is not aligned with said emitter.

4. The transistor of claim 1 wherein said shallow isolation extension region is formed of an oxide material selected from the group consisting of oxidized-doped-silicon and a deposited silicon oxide.

5. The transistor of claim 1 wherein said shallow isolation extension region is formed of a material having a lower dielectric constant than said STI regions.

6. The transistor of claim 1 wherein said shallow isolation extension region overlaps said inner ends and top surfaces of said STI regions.

7. The transistor of claim 1 wherein said shallow isolation extension region extends beneath said edges of said base region.

8. The transistor of claim 1 wherein said intrinsic base region is composed of a material selected from the group consisting of doped crystalline silicon and silicon germanium.

9. The transistor of claim 1 wherein said isolation extension region extends into the doped collector region thereby modifying the resistance of the collector region.

10. A bipolar vertical transistor formed in a silicon semiconductor substrate comprising:
    said silicon semiconductor substrate having an upper surface,
    shadow trench isolation (STI) regions composed of a dielectric material formed in said silicon semiconductor substrate having inner sidewalls and top surfaces,
    a doped collector region formed completely within said silicon semiconductor substrate between a pair of said STI regions,
    said doped collector region having a top surface which comprises said upper surface of said silicon semiconductor substrate, so that said doped collector region has a top surface which comprises said upper surface of said silicon semiconductor substrate,
    a counterdoped intrinsic base region formed on top of said collector region directly on said upper surface of said silicon semiconductor substrate between said pair of said STI regions with a margin between said intrinsic base region and said pair of said STI regions, said intrinsic base region having edges,
    lateral isolation extension recesses formed between said lateral edges of said intrinsic base region and said inner sidewalls of said pair of said STI regions,
    said intrinsic base region being composed of a material selected from the group consisting of doped crystalline silicon and silicon germanium,
    a doped emitter region formed of doped polysilicon above said intrinsic base region spaced away from said edges, and
    a shallow isolation extension region composed of a dielectric material juxtaposed with said edges of said intrinsic base region formed in said margin between said inner sidewalls of said pair of said STI regions and edges of said intrinsic base region,
    whereby said shallow isolation extension region reduces the base-to-collector parasitic capacitance of said bipolar transistor.

11. The transistor of claim 10 wherein said shallow isolation extension region is formed of an oxide of said substrate.

12. The transistor of claim 10 wherein said shallow isolation extension region is formed of a material having a lower dielectric constant than said STI regions.

13. The transistor of claim 10 wherein said shallow isolation extension region extends beneath said edges of said base region.

14. A bipolar vertical transistor formed in a silicon semiconductor substrate comprising:
    said silicon semiconductor substrate having an upper surface,
    shallow trench isolation (STI) regions composed of a dielectric material formed in said upper surface of said silicon semiconductor substrate, said STI regions having inner sidewalls and top surfaces, a doped collector region formed completely within said substrate between a pair of said STI regions with a raised collector region formed centrally above the remainder of the collector region which is recessed proximate to said pair of said STI regions by a lateral extension recess, an intrinsic base-collector pedestal comprising a counter-doped intrinsic base region formed directly on said upper surface of said silicon semiconductor substrate on top of said raised collector region between said inner sidewalls of said pair of said pair of said STI regions with a margin between said intrinsic base-collector pedestal and said pair of pair of said STI regions, said intrinsic base-collector pedestal having edges which are proved by said intrinsic base and of said raised collector region and which are aligned, lateral isolation extension recesses formed between said lateral edges of said intrinsic base-collector pedestal and said inner sidewalls of said pair of said STI regions, said lateral isolation extension recesses separating said intrinsic base-collector pedestal from said pair of said STI regions, a doped emitter region formed above said intrinsic base region spaced away from said edges of said intrinsic base-collector pedestal, and a shallow isolation extension region composed of a dielectric material juxtaposed with said edges of said intrinsic base-collector pedestal formed in said lateral isolation extension recess in said margin between said inner sidewalls of said pair of said STI regions and said edges of said intrinsic base-collector pedestal, whereby said shallow isolation extension region reduces the base-to-collector parasitic capacitance of said bipolar transistor.

15. The transistor of claim 1 wherein:

said shallow isolation extension region overlaps said inner ends and top surfaces of said pair of said STI regions, and an extrinsic base region covers said shallow isolation extension region and extends partially over said intrinsic base region in mechanical and electrical contact therewith.

16. The transistor of claim 1 wherein:

said shallow isolation extension region overlaps said inner ends and top surfaces of said pair of said STI regions, an extrinsic base region covers said shallow isolation extension region and extends partially over said intrinsic base region in mechanical and electrical contact therewith, and a silicon nitride cap is formed over said emitter region and silicon nitride sidewall spacers formed on sidewalls of said emitter region.

17. The transistor of claim 10 wherein:

said shallow isolation extension region overlaps said inner ends and top surfaces of said pair of said STI regions, an an extrinsic base region covers said shallow isolation extension region and extends partially over said intrinsic base region in mechanical and electrical contact therewith.

18. The transistor of claim 10 wherein:

said shallow isolation extension region overlaps said inner ends and top surfaces of said pair of said STI regions, an extrinsic base region covers said shallow isolation extension region and extends partially over said intrinsic base region in mechanical and electrical contact therewith, and a silicon nitride cap is formed over said emitter region and silicon nitride sidewall spacers formed on sidewalls of said emitter region.

19. The transistor of claim 14 wherein:

said shallow isolation extension region overlaps said inner ends and top surfaces of said pair of said STI regions, and an extrinsic base region covers said shallow isolation extension region and extends partially over said intrinsic base region in mechanical and electrical contact therewith.

20. The transistor of claim 14 wherein:

said shallow isolation extension region overlaps said inner ends and top surfaces of said pair of said STI regions, an extrinsic base region covers said shallow isolation extension region and extends partially over said intrinsic base region in mechanical and electrical contact therewith, and a silicon nitride cap is formed over said emitter region and silicon nitride sidewall spacers formed on sidewalls of said emitter region.

* * * * *